United States Patent
Elgousi et al.

(10) Patent No.: US 12,418,267 B2
(45) Date of Patent: Sep. 16, 2025

(54) HARMONIC TRAPPING TECHNIQUES FOR TRANSMITTER INTERSTAGE MATCHING

(71) Applicant: Intel Corporation, Santa Clara, CA (US)

(72) Inventors: Muhammed Elgousi, Chandler, AZ (US); Chuanzhao Yu, Phoenix, AZ (US); Hyun Yoon, Gilbert, AZ (US); Xi Li, Chandler, AZ (US); LiChung Tony Chang, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 756 days.

(21) Appl. No.: 17/559,341

(22) Filed: Dec. 22, 2021

(65) Prior Publication Data

US 2023/0198479 A1    Jun. 22, 2023

(51) Int. Cl.
*H03F 3/21* (2006.01)
*H03F 1/26* (2006.01)
*H03F 3/00* (2006.01)

(52) U.S. Cl.
CPC ............ *H03F 3/21* (2013.01); *H03F 1/26* (2013.01); *H03F 3/005* (2013.01); *H03F 2200/372* (2013.01)

(58) Field of Classification Search
CPC ... H03F 3/21; H03F 1/26; H03F 3/005; H03F 2200/372; H03F 2200/451; H03F 3/193; H03F 1/565; H03F 3/245
USPC ................... 330/250, 262–261, 302
See application file for complete search history.

(56) References Cited

U.S. PATENT DOCUMENTS 8,112,044 B2 *  2/2012  Marholev ............... H04B 5/48
                                                455/90.3

FOREIGN PATENT DOCUMENTS

DE       102022133755 A1    6/2023

\* cited by examiner

*Primary Examiner* — Hieu P Nguyen
(74) *Attorney, Agent, or Firm* — Schwegman Lundberg & Woessner, P.A.

(57) ABSTRACT

A method for harmonic trapping in a matching network of a power amplifier includes determining primary inductance and secondary inductance of a differential transformer of the matching network, based on a signal operating frequency of the power amplifier. An inductance value for an L-C filter is determined based on the secondary inductance and a harmonic frequency of a local oscillator (LO) signal. A capacitance value for the L-C filter is determined based on the inductance value and the harmonic frequency of the LO signal. The L-C filter is provided on an electric connection between a direct current (DC) bias voltage source and a secondary inductor of the differential transformer. The L-C filter is configured with the determined inductance value and the determined capacitance value.

20 Claims, 14 Drawing Sheets

HARMONIC TRAPPING TECHNIQUES FOR TRANSMITTER INTERSTAGE MATCHING

TECHNICAL FIELD

Various embodiments generally may relate to the field of radio frequency (RF) signal communication by a wireless device, including harmonic trapping techniques for transmitter interstage matching.

BACKGROUND

With the increased popularity of wireless communications such as fifth-generation (5G) communications and subsequent sixth-generation (6G) communications and beyond, there is a growing demand for increased flexibility and efficiency in using the communication bandwidth by wireless devices, including reducing non-linearities and interference signals associated with signal processing in transceiver systems of wireless devices.

BRIEF DESCRIPTION OF THE DRAWINGS

In the drawings, like numerals may describe the same or similar components or features in different views. Like numerals having different letter suffixes may represent different instances of similar components. Some embodiments are illustrated by way of example, and not limitation, in the figures of the accompanying drawings in which.

DETAILED DESCRIPTION

The following detailed description refers to the accompanying drawings. The same reference numbers may be used in different drawings to identify the same or similar elements. In the following description, for purposes of explanation and not limitation, specific details are set forth such as particular structures, architectures, interfaces, techniques, etc. to provide a thorough understanding of the various aspects of various embodiments. However, it will be apparent to those skilled in the art having the benefit of the present disclosure that the various aspects of the various embodiments may be practiced in other examples that depart from these specific details. In certain instances, descriptions of well-known devices, circuits, and methods are omitted so as not to obscure the description of the various embodiments with unnecessary detail.

The following description and the drawings sufficiently illustrate specific embodiments to enable those skilled in the art to practice them. Other embodiments may incorporate structural, logical, electrical, process, and other changes. Portions and features of some embodiments may be included in or substituted for, those of other embodiments. Embodiments outlined in the claims encompass all available equivalents of those claims.

In some embodiments, due to the differential nature of in-phase (I) and quadrature (Q) mixing with a differential local oscillator (LO) frequency, even-order harmonics of the LO signal will be generated. In low-frequency LO systems (e.g., wireless systems operating below 10 GHz), the 4th order harmonic noise power generates a spur at the main channel for millimeter-wave (mmWave) applications, such as 5G and beyond wireless systems.

The disclosed techniques include using a harmonic trapping circuit such as a filter arrangement (e.g., at least one L-C filter) located between the matching circuitry transformer and the output of a direct current (DC) bias voltage source of the power amplifier (PA). Usage of the disclosed techniques (e.g., the disclosed filter arrangement which can include an LO noise rejection filter such as an L-C filter for one or more LO signal harmonics) can be ascertained by visual inspection of the matching network (e.g., via micrograph of the die at the input of the PA matching circuitry). The LO noise rejection filter inductor can be implemented within the periphery of the PA input transformer to save area and reduce routing parasitics, and usage of the disclosed techniques may be assessed by PA input transformer inspection.

Additional functionalities of the harmonic trapping circuit are discussed in connection with at least FIGS. 1, 2, and 5-14.

Figure 1:
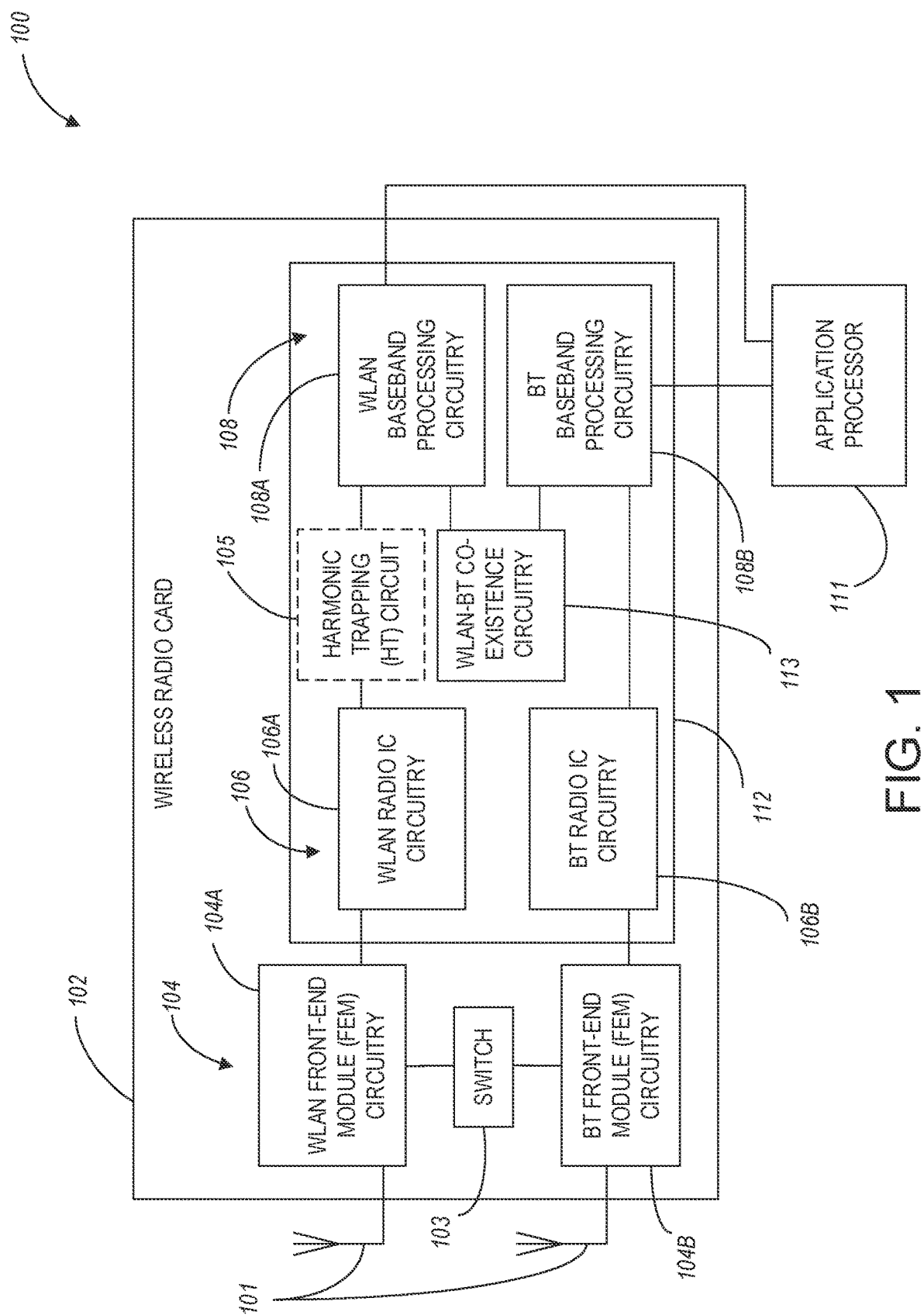
FIG. 1 is a block diagram of a radio architecture with a harmonic trapping circuit, in accordance with some embodiments.

FIG. 1 is a block diagram of a radio architecture 100 with a harmonic trapping circuit, in accordance with some embodiments. The radio architecture 100 may be implemented in a computing device (e.g., device 1500 in FIG. 15) including user equipment (UE), a base station (e.g., a next generation Node-B (gNB), enhanced Node-B (eNB)), a smartphone, or another type of wired or wireless device. The radio architecture 100 may include radio front-end module (FEM) circuitry 104, radio integrated circuit (IC) circuitry 106, and baseband processing circuitry 108. Radio architecture 100 as shown includes both Wireless Local Area Network (WLAN) functionality and Bluetooth (BT) functionality although embodiments are not so limited and the disclosed techniques apply to other types of radio architectures as well. In this disclosure, "WLAN" and "Wi-Fi" are used interchangeably. In some aspects, a single wireless functionality can be configured (e.g., one of WLAN, BT, or another type of wires functionality).

FEM circuitry 104 may include a WLAN or Wi-Fi FEM circuitry 104A and a Bluetooth (BT) FEM circuitry 104B. The WLAN FEM circuitry 104A may include a receive signal path comprising circuitry configured to operate on WLAN RF signals received from one or more antennas 101, to amplify the received signals, and to provide the amplified versions of the received signals to the WLAN radio IC circuitry 106A for further processing. The BT FEM circuitry 104B may include a receive signal path which may include circuitry configured to operate on BT RF signals received from the one or more antennas 101, to amplify the received signals and to provide the amplified versions of the received signals to the BT radio IC circuitry 106B for further processing. The FEM circuitry 104A may also include a transmit signal path which may include circuitry configured to amplify WLAN signals provided by the radio IC circuitry 106A for wireless transmission by the one or more antennas 101. Besides, the FEM circuitry 104B may also include a transmit signal path which may include circuitry configured to amplify BT signals provided by the radio IC circuitry 106B for wireless transmission by the one or more antennas. In the embodiment of FIG. 1, although FEM circuitry 104A and FEM circuitry 104B are shown as being distinct from one another, embodiments are not so limited and include within their scope the use of a FEM (not shown) that includes a transmit path and/or a receive path for both WLAN and BT signals, or the use of one or more FEM circuitries where at least some of the FEM circuitries share transmit and/or receive signal paths for both WLAN and BT signals.

Radio IC circuitry 106 as shown may include WLAN radio IC circuitry 106A and BT radio IC circuitry 106B. The WLAN radio IC circuitry 106A may include a receive signal path which may include circuitry to down-convert WLAN RF signals received from the FEM circuitry 104A and provide baseband signals to WLAN baseband processing circuitry 108A. The BT radio IC circuitry 106B may, in turn, include a receive signal path which may include circuitry to down-convert BT RF signals received from the FEM circuitry 104B and provide baseband signals to BT baseband processing circuitry 108B. The WLAN radio IC circuitry 106A may also include a transmit signal path which may include circuitry to up-convert WLAN baseband signals provided by the WLAN baseband processing circuitry 108A and provide WLAN RF output signals to the FEM circuitry 104A for subsequent wireless transmission by the one or more antennas 101. The BT radio IC circuitry 106B may also include a transmit signal path which may include circuitry to up-convert BT baseband signals provided by the BT baseband processing circuitry 108B and provide BT RF output signals to the FEM circuitry 104B for subsequent wireless transmission by the one or more antennas 101. In the embodiment of FIG. 1, although radio IC circuitries 106A and 106B are shown as being distinct from one another, embodiments are not so limited and include within their scope the use of a radio IC circuitry (not shown) that includes a transmit signal path and/or a receive signal path for both WLAN and BT signals, or the use of one or more radio IC circuitries where at least some of the radio IC circuitries share transmit and/or receive signal paths for both WLAN and BT signals.

Baseband processing circuitry 108 may include a WLAN baseband processing circuitry 108A and a BT baseband processing circuitry 108B. The WLAN baseband processing circuitry 108A may include a memory, such as, for example, a set of RAM arrays in a Fast Fourier Transform (FFT) or Inverse Fast Fourier Transform (IFFT) block (not shown) of the WLAN baseband processing circuitry 108A. Each of the WLAN baseband processing circuitry 108A and the BT baseband processing circuitry 108B may further include one or more processors and control logic to process the signals received from the corresponding WLAN or BT receive signal path of the radio IC circuitry 106, and to also generate corresponding WLAN or BT baseband signals for the transmit signal path of the radio IC circuitry 106. Each of the baseband processing circuitries 108A and 108B may further include physical layer (PHY) and medium access control layer (MAC) circuitry and may further interface with the application processor 111 for generation and processing of the baseband signals and for controlling operations of the radio IC circuitry 106.

Figure 2:
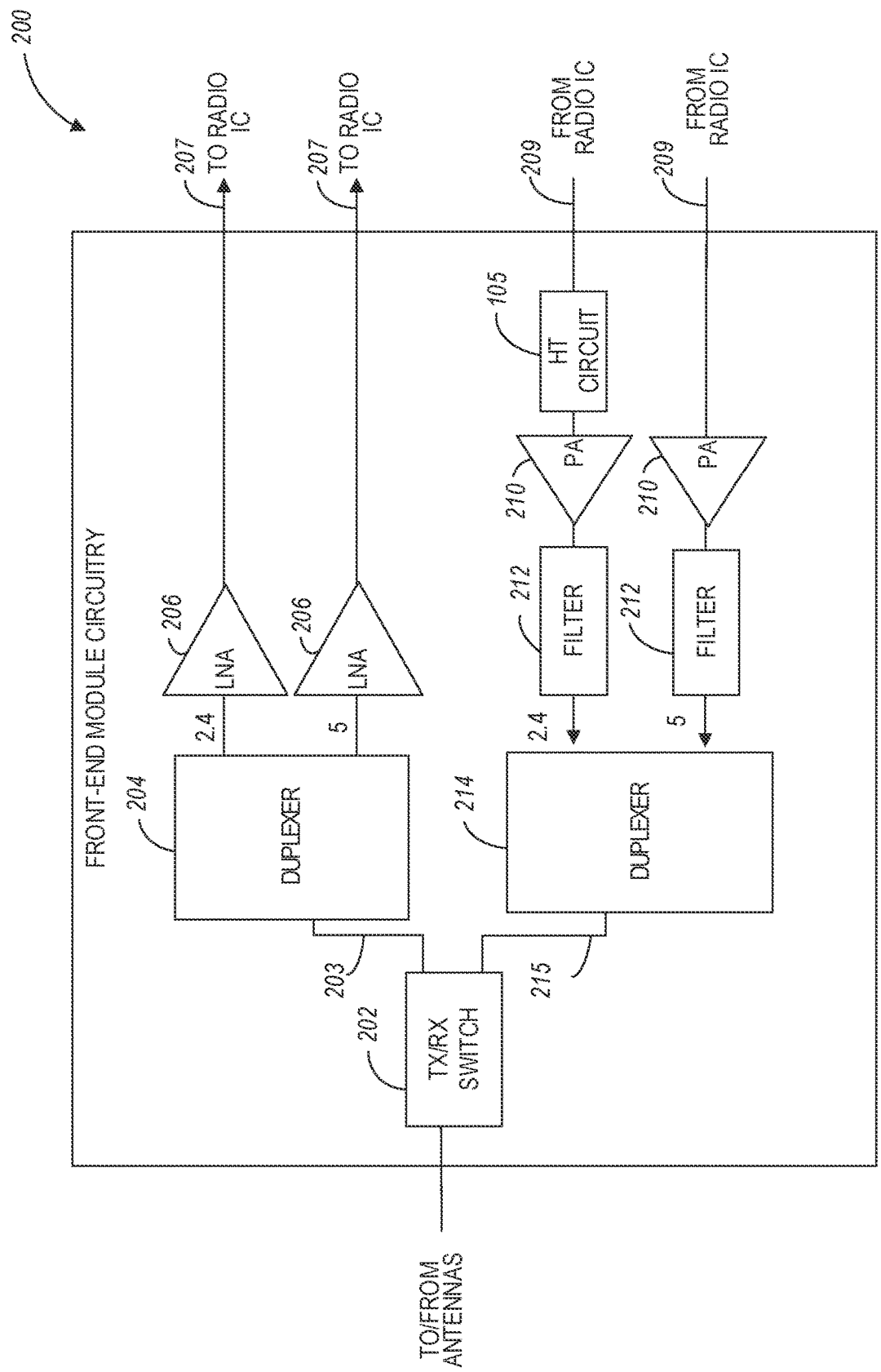
FIG. 2 illustrates a front-end module circuitry for use in the radio architecture of FIG. 1, in accordance with some embodiments.
Figure 3:
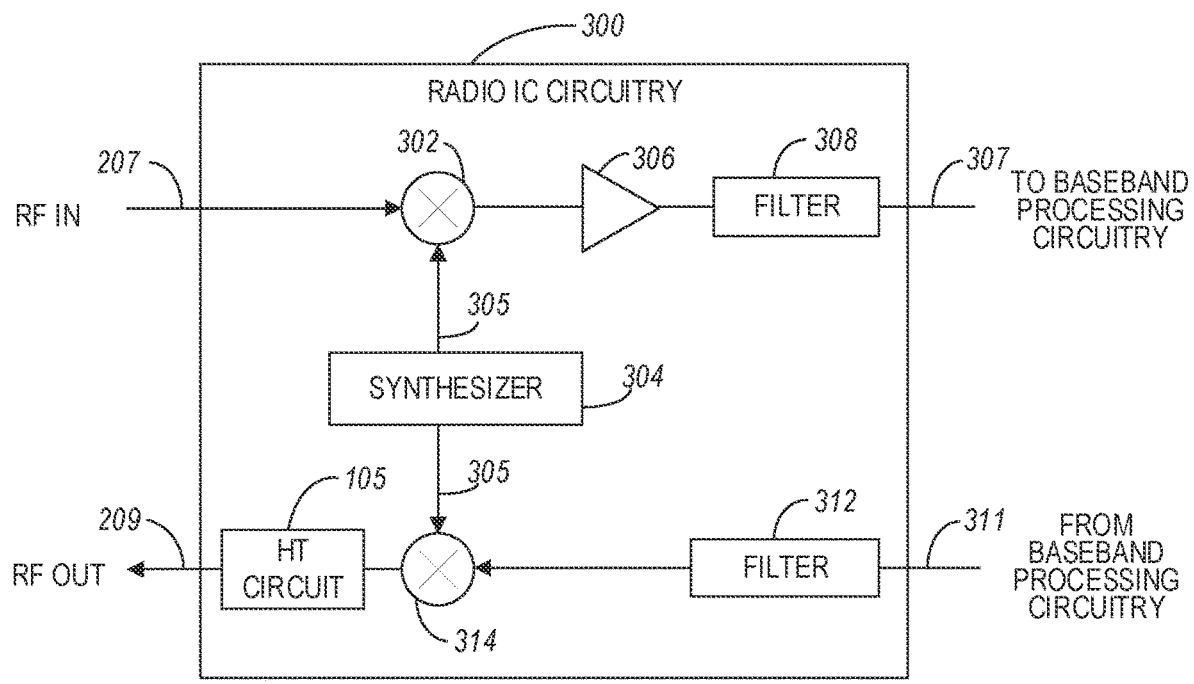
FIG. 3 illustrates a radio IC circuitry for use in the radio architecture of FIG. 1, in accordance with some embodiments.

In some embodiments, radio architecture 100 includes a harmonic trapping (HT) circuit 105 configured to filter out one or more harmonics (e.g., even-order harmonics) of a local oscillator (LO) signal. In some embodiments, the HT circuit 105 can be configured as part of the FEM circuitry 104 (e.g., before the PA as illustrated in FIG. 2) or as part of the radio IC circuitry 106 (e.g., after the mixer as illustrated in FIG. 3). The functionality of the HT circuit is discussed in greater detail in connection with FIGS. 5-14.

Referring still to FIG. 1, according to the shown embodiment, WLAN-BT coexistence circuitry 113 may include logic providing an interface between the WLAN baseband processing circuitry 108A and the BT baseband processing circuitry 108B to enable use cases requiring WLAN and BT coexistence. In addition, a switch 103 may be provided between the WLAN FEM circuitry 104A and the BT FEM circuitry 104B to allow switching between the WLAN and BT radios according to application needs. In addition, although the one or more antennas 101 are depicted as being respectively connected to the WLAN FEM circuitry 104A and the BT FEM circuitry 104B, embodiments include within their scope the sharing of the one or more antennas 101 as between the WLAN and BT FEMs, or the provision of more than one antenna connected to each of FEM 104A or 104B.

In some embodiments, the front-end module circuitry 104, the radio IC circuitry 106, and the baseband processing circuitry 108 may be provided on a single radio card, such as wireless radio card 102. In some other embodiments, the one or more antennas 101, the FEM circuitry 104, and the radio IC circuitry 106 may be provided on a single radio card. In some other embodiments, the radio IC circuitry 106 and the baseband processing circuitry 108 may be provided on a single chip or IC, such as IC 112.

In some embodiments, the wireless radio card 102 may include a WLAN radio card and may be configured for Wi-Fi communications, although the scope of the embodiments is not limited in this respect. In some of these embodiments, the radio architecture 100 may be configured to receive and transmit orthogonal frequency division multiplexed (OFDM) or orthogonal frequency division multiple access (OFDMA) communication signals over a multicarrier communication channel. The OFDM or OFDMA signals may comprise a plurality of orthogonal subcarriers. In some embodiments, the wireless radio card 102 may include a platform controller hub (PCH) system-on-a-chip (SOC) and a central processing unit (CPU)/host SOC.

In some of these multicarrier embodiments, radio architecture 100 may be part of a Wi-Fi communication station (STA) such as a wireless access point (AP), a base station, or a mobile device including a Wi-Fi enabled device. In some of these embodiments, radio architecture 100 may be configured to transmit and receive signals in accordance with specific communication standards and/or protocols, such as any of the Institute of Electrical and Electronics Engineers (IEEE) standards including, 802.11n-2009, IEEE 802.11-2012, 802.11n-2009, 802.11ac, IEEE 802.11-2016, and/or 802.11ax standards and/or proposed specifications for WLANs, although the scope of embodiments is not limited in this respect. Radio architecture 100 may also be suitable to transmit and/or receive communications in accordance with other techniques and standards, including a $3^{rd}$ Generation Partnership Project (3GPP) standard, including a communication standard used in connection with 5G or new radio (NR) communications.

In some embodiments, the radio architecture 100 may be configured for high-efficiency (HE) Wi-Fi communications in accordance with the IEEE 802.1 lax standard or another standard associated with wireless communications. In these embodiments, the radio architecture 100 may be configured to communicate in accordance with an OFDMA technique, although the scope of the embodiments is not limited in this respect.

In some other embodiments, the radio architecture 100 may be configured to transmit and receive signals transmitted using one or more other modulation techniques such as spread spectrum modulation (e.g., direct sequence code division multiple access (DS-CDMA) and/or frequency hopping code division multiple access (FH-CDMA)), time-division multiplexing (TDM) modulation, and/or frequency-division multiplexing (FDM) modulation, although the scope of the embodiments is not limited in this respect.

In some embodiments, as further shown in FIG. 1, the BT baseband processing circuitry 108B may be compliant with a Bluetooth (BT) connectivity standard such as Bluetooth, Bluetooth 4.0 or Bluetooth 5.0, or any other iteration of the Bluetooth Standard. In embodiments that include BT functionality as shown for example in FIG. 1, the radio architecture 100 may be configured to establish a BT synchronous connection-oriented (SCO) link and or a BT low energy (BT LE) link. In some of the embodiments that include functionality, the radio architecture 100 may be configured to establish an extended SCO (eSCO) link for BT communications, although the scope of the embodiments is not limited in this respect. In some of these embodiments that include a BT functionality, the radio architecture may be configured to engage in a BT Asynchronous Connection-Less (ACL) communications, although the scope of the embodiments is not limited in this respect. In some embodiments, as shown in FIG. 1, the functions of a BT radio card and WLAN radio card may be combined on a single wireless radio card, such as the single wireless radio card 102, although embodiments are not so limited, and include within their scope discrete WLAN and BT radio cards In some embodiments, the radio architecture 100 may include other radio cards, such as a cellular radio card configured for cellular (e.g., 3GPP such as LTE, LTE-Advanced, or 5G communications).

In some IEEE 802.11 embodiments, the radio architecture 100 may be configured for communication over various channel bandwidths including bandwidths having center frequencies of about 900 MHz, 2.4 GHz, 5 GHz, and bandwidths of about 1 MHz, 2 MHz, 2.5 MHz, 4 MHz, 5 MHz, 8 MHz, 10 MHz, 16 MHz, 20 MHz, 40 MHz, 80 MHz (with contiguous bandwidths) or 80+80 MHz (160 MHz) (with non-contiguous bandwidths). In some embodiments, a 320 MHz channel bandwidth may be used. The scope of the embodiments is not limited with respect to the above center frequencies, however.

FIG. 2 illustrates FEM circuitry 200 in accordance with some embodiments. The FEM circuitry 200 is one example of circuitry that may be suitable for use as the WLAN and/or BT FEM circuitry 104A/104B (FIG. 1), although other circuitry configurations may also be suitable.

In some embodiments, the FEM circuitry 200 may include a TX/RX switch 202 to switch between transmit (TX) mode and receive (RX) mode operation. In some aspects, a diplexer may be used in place of a TX/RX switch. The FEM circuitry 200 may include a receive signal path and a transmit signal path. The receive signal path of the FEM circuitry 200 may include a low-noise amplifier (LNA) 206 to amplify received RF signals 203 and provide the amplified received RF signals 207 as an output (e.g., to the radio IC circuitry 106 (FIG. 1)). The transmit signal path of the FEM circuitry 200 may include a power amplifier (PA) 210 to amplify input RF signals 209 (e.g., provided by the radio IC circuitry 106), and one or more filters 212, such as band-pass filters (BPFs), low-pass filters (LPFs) or other types of filters, to generate RF signals 215 for subsequent transmission (e.g., by the one or more antennas 101 in FIG. 1).

In some dual-mode embodiments for Wi-Fi communication, the FEM circuitry 200 may be configured to operate in, e.g., either the 2.4 GHz frequency spectrum or the 5 GHz frequency spectrum. In these embodiments, the receive signal path of the FEM circuitry 200 may include a receive signal path duplexer 204 to separate the signals from each spectrum as well as provide a separate LNA 206 for each spectrum as shown. In these embodiments, the transmit signal path of the FEM circuitry 200 may also include a PA 210 and one or more filters 212, such as a BPF, an LPF, or another type of filter for each frequency spectrum, and a transmit signal path duplexer 214 to provide the signals of one of the different spectrums onto a single transmit path for subsequent transmission by the one or more antennas 101 (FIG. 1). In some embodiments, BT communications may utilize the 2.4 GHz signal paths and may utilize the same FEM circuitry 200 as the one used for WLAN communications.

In some embodiments, the input RF signals 209 can be configured as an input to HT circuit 105. In some embodiments, the input RF signal 209 is a differential baseband signal generated based on an LO signal (e.g., LO signal generated by synthesizer circuitry 304 in FIG. 3). The mixer (e.g., mixer circuitry 314) can drive the PA 210 using the differential baseband signal which is received by a transformer of the PA 210. In some embodiments, the HT circuit 105 can be a filter arrangement within the FEM circuitry 104, placed between a DC bias voltage source of the PA 210 and the transformer, to filter even-order harmonics associated with the LO signal and present within the differential baseband signal.

FIG. 3 illustrates radio IC circuitry 300 in accordance with some embodiments. The radio IC circuitry 300 is one example of circuitry that may be suitable for use as the WLAN or BT radio IC circuitry 106A/106B (FIG. 1), although other circuitry configurations may also be suitable.

In some embodiments, the radio IC circuitry 300 may include a receive signal path and a transmit signal path. The receive signal path of the radio IC circuitry 300 may include mixer circuitry 302, such as, for example, down-conversion mixer circuitry, amplifier circuitry 306, and filter circuitry 308. The transmit signal path of the radio IC circuitry 300 may include at least filter circuitry 312 and mixer circuitry 314, such as up-conversion mixer circuitry. Radio IC circuitry 300 may also include synthesizer circuitry 304 for synthesizing a frequency 305 for use by the mixer circuitry 302 and the mixer circuitry 314. The mixer circuitry 302 and/or 314 may each, according to some embodiments, be configured to provide direct conversion functionality. The latter type of circuitry presents a much simpler architecture as compared with standard super-heterodyne mixer circuitries, and any flicker noise brought about by the same may be alleviated for example through the use of OFDM modulation. FIG. 3 illustrates only a simplified version of a radio IC circuitry and may include, although not shown, embodiments where each of the depicted circuitries may include more than one component. For instance, mixer circuitry 302 and/or 314 may each include one or more mixers, and filter circuitries 308 and/or 312 may each include one or more filters, such as one or more BPFs and/or LPFs according to application needs. For example, when mixer circuitries are of the direct-conversion type, they may each include two or more mixers.

In some embodiments, mixer circuitry 302 may be configured to down-convert RF signals 207 received from the FEM circuitry 104 (FIG. 1) based on the synthesized frequency 305 provided by the synthesizer circuitry 304. The amplifier circuitry 306 may be configured to amplify the down-converted signals and the filter circuitry 308 may include an LPF configured to remove unwanted signals from the down-converted signals to generate output baseband signals 307. Output baseband signals 307 may be provided to the baseband processing circuitry 108 (FIG. 1) for further processing. In some embodiments, the output baseband signals 307 may be zero-frequency baseband signals, although this is not a requirement. In some embodiments, mixer circuitry 302 may comprise passive mixers, although the scope of the embodiments is not limited in this respect.

In some embodiments, the mixer circuitry 314 may be configured to up-convert input baseband signals 311 based on the synthesized frequency 305 provided by the synthesizer circuitry 304 to generate input RF signals 209 for the FEM circuitry 104. The baseband signals 311 may be provided by the baseband processing circuitry 108 and may be filtered by filter circuitry 312. The filter circuitry 312 may include an LPF or a BPF, although the scope of the embodiments is not limited in this respect.

In some embodiments, the mixer circuitry 302 and the mixer circuitry 314 may each include two or more mixers and may be arranged for quadrature down-conversion and/or up-conversion respectively with the help of the synthesizer circuitry 304. In some embodiments, the mixer circuitry 302 and the mixer circuitry 314 may each include two or more mixers each configured for image rejection (e.g., Hartley image rejection). In some embodiments, the mixer circuitry 302 and the mixer circuitry 314 may be arranged for direct down-conversion and/or direct up-conversion, respectively. In some embodiments, the mixer circuitry 302 and the mixer circuitry 314 may be configured for super-heterodyne operation, although this is not a requirement.

In some embodiments, the HT circuit 105 can be configured as part of the radio IC circuitry 300 and can be placed after the mixer circuitry 314, at the input of the PA 210. Additional functionalities of the HT circuit are discussed in connection with FIGS.

Mixer circuitry 302 may comprise, according to one embodiment: quadrature passive mixers (e.g., for the in-phase (I) and quadrature-phase (Q) paths). In such an embodiment, RF input signal 207 from FIG. 2 may be down-converted to provide I and Q baseband output signals to be sent to the baseband processor.

Quadrature passive mixers may be driven by zero and ninety-degree time-varying LO switching signals provided by a quadrature circuitry which may be configured to receive a LO frequency (fLO) from a local oscillator or a synthesizer, such as synthesized frequency 305 of synthesizer circuitry 304 (FIG. 3). In some embodiments, the LO frequency may be the carrier frequency, while in other embodiments, the LO frequency may be a fraction of the carrier frequency (e.g., one-half the carrier frequency, one-third the carrier frequency). In some embodiments, the zero and ninety-degree time-varying switching signals may be generated by the synthesizer, although the scope of the embodiments is not limited in this respect.

In some embodiments, the LO signals may differ in the duty cycle (the percentage of one period in which the LO signal is high) and/or offset (the difference between start points of the period). In some embodiments, the LO signals may have a 25% duty cycle and a 50% offset. In some embodiments, each branch of the mixer circuitry (e.g., the in-phase (I) and quadrature-phase (Q) path) may operate at a 25% duty cycle, which may result in a significant reduction in power consumption.

The RF input signal 207 (FIG. 2) may comprise a balanced signal, although the scope of the embodiments is not limited in this respect. The I and Q baseband output signals may be provided to the low-noise amplifier, such as amplifier circuitry 306 (FIG. 3) or to filter circuitry 308 (FIG. 3).

In some embodiments, the output baseband signals 307 and the input baseband signals 311 may be analog, although the scope of the embodiments is not limited in this respect. In some alternate embodiments, the output baseband signals 307 and the input baseband signals 311 may be digital. In these alternate embodiments, the radio IC circuitry may include an analog-to-digital converter (ADC) and digital-to-analog converter (DAC) circuitry.

In some dual-mode embodiments, a separate radio IC circuitry may be provided for processing signals for each spectrum, or for other spectrums not mentioned here, although the scope of the embodiments is not limited in this respect.

In some embodiments, the synthesizer circuitry 304 may be a fractional-N synthesizer or a fractional N/N+1 synthesizer, although the scope of the embodiments is not limited in this respect as other types of frequency synthesizers may be suitable. In some embodiments, the synthesizer circuitry 304 may be a delta-sigma synthesizer, a frequency multiplier, or a synthesizer comprising a phase-locked loop with a frequency divider. According to some embodiments, the synthesizer circuitry 304 may include a digital frequency synthesizer circuitry. An advantage of using a digital synthesizer circuitry is that, although it may still include some analog components, its footprint may be scaled down much more than the footprint of an analog synthesizer circuitry. In some embodiments, frequency input into synthesizer circuitry 304 may be provided by a voltage-controlled oscillator (VCO), although that is not a requirement. A divider control input may further be provided by either the baseband processing circuitry 108 (FIG. 1) or the application processor 111 (FIG. 1) depending on the desired output frequency 305. In some embodiments, a divider control input (e.g., N) may be determined from a look-up table (e.g., within a Wi-Fi card) based on a channel number and a channel center frequency as determined or indicated by the application processor 11.

In some embodiments, synthesizer circuitry 304 may be configured to generate a carrier frequency as the output frequency 305, while in other embodiments, the output frequency 305 may be a fraction of the carrier frequency (e.g., one-half the carrier frequency, one-third the carrier frequency). In some embodiments, the output frequency 305 may be a LO frequency (fLO).

Figure 4:
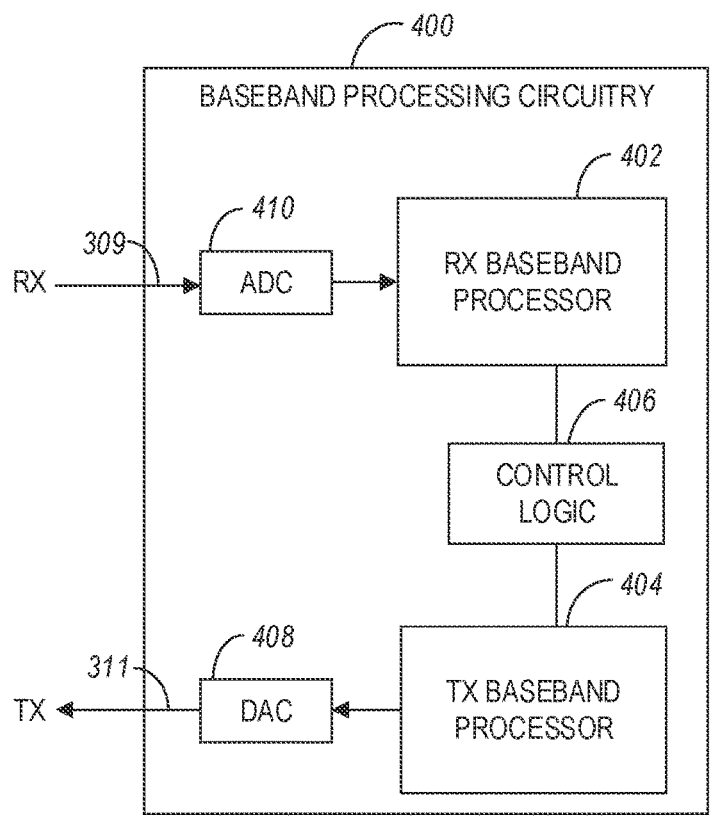
FIG. 4 illustrates a baseband processing circuitry for use in the radio architecture of FIG. 1, in accordance with some embodiments.

FIG. 4 illustrates a functional block diagram of baseband processing circuitry 400 in accordance with some embodiments. The baseband processing circuitry 400 is one example of circuitry that may be suitable for use as the baseband processing circuitry 108 (FIG. 1), although other circuitry configurations may also be suitable. The baseband processing circuitry 400 may include a receive baseband processor (RX BBP) 402 for processing received analog baseband signals 309 provided by the radio IC circuitry 106 (FIG. 1) and a transmit baseband processor (TX BBP) 404 for generating analog input baseband signals 311 for the radio IC circuitry 106. The baseband processing circuitry 400 may also include control logic 406 for coordinating the operations of the baseband processing circuitry 400.

In some embodiments (e.g., when analog baseband signals are exchanged between the baseband processing circuitry 400 and the radio IC circuitry 106), the baseband processing circuitry 400 may include an analog-to-digital converter (ADC) 410 to convert analog baseband signals 309 received from the radio IC circuitry 106 to digital baseband signals for processing by the RX BBP 402. In these embodiments, the baseband processing circuitry 400 may also include a digital-to-analog converter (DAC) 408 to convert digital baseband signals from the TX BBP 404 to analog input baseband signals 311.

In some embodiments that communicate OFDM signals or OFDMA signals, such as through the WBPC 108A, the TX BBP 404 may be configured to generate OFDM or OFDMA signals as appropriate for transmission by performing an inverse fast Fourier transform (IFFT). The RX BBP 402 may be configured to process received OFDM signals or OFDMA signals by performing an FFT. In some embodiments, the RX BBP 402 may be configured to detect the presence of an OFDM signal or OFDMA signal by performing an autocorrelation, to detect a preamble, such as a short preamble, and by performing a cross-correlation, to detect a long preamble. The preambles may be part of a predetermined frame structure for Wi-Fi communication.

Referring back to FIG. 1, in some embodiments, the one or more antennas 101 (FIG. 1) may each comprise one or more directional or omnidirectional antennas, including, for example, dipole antennas, monopole antennas, patch antennas, loop antennas, microstrip antennas or other types of antennas suitable for transmission of RF signals. In some multiple-input multiple-output (MIMO) embodiments, the antennas may be effectively separated to take advantage of spatial diversity and the different channel characteristics that may result. The one or more antennas 101 may each include a set of phased-array antennas, although embodiments are not so limited.

Although the radio architecture 100 is illustrated as having several separate functional elements, one or more of the functional elements may be combined and may be implemented by combinations of software configured elements, such as processing elements including digital signal processors (DSPs), and/or other hardware elements. For example, some elements may comprise one or more microprocessors, DSPs, field-programmable gate arrays (FPGAs), application-specific integrated circuits (ASICs), radio-frequency integrated circuits (RFICs), and combinations of various hardware and logic circuitry for performing at least the functions described herein. In some embodiments, the functional elements may refer to one or more processes operating on one or more processing elements.

Figure 5:
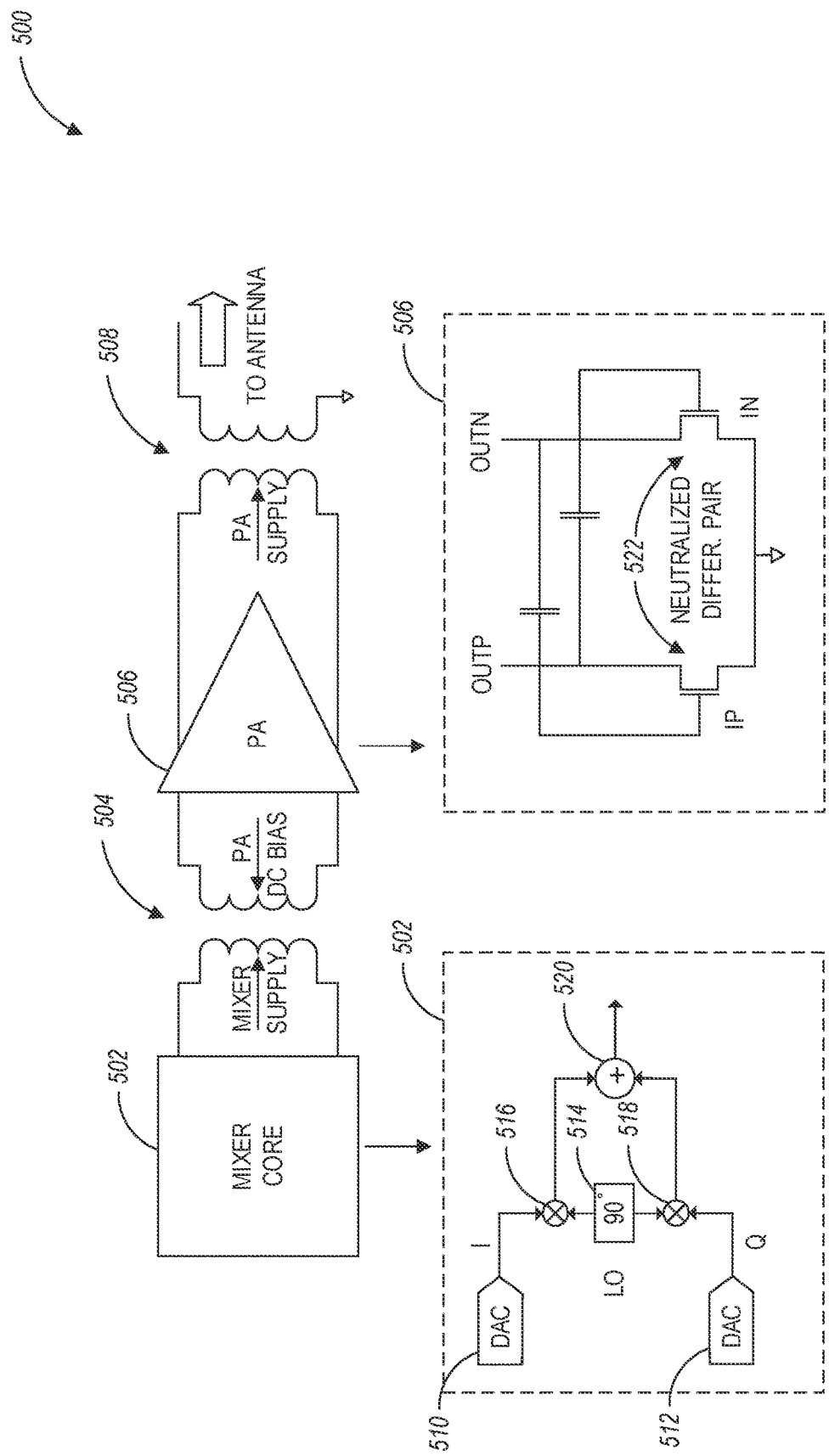
FIG. 5 illustrates a block diagram of RF circuitry including mixer core circuitry driving a power amplifier (PA) circuitry, in accordance with some embodiments.

FIG. 5 illustrates a block diagram of RF circuitry 500 including mixer core circuitry driving a power amplifier (PA) circuitry, in accordance with some embodiments. Referring to FIG. 5, RF circuitry 500 includes a mixer core 502, matching circuitry (or matching network) 504, PA 506, and output balun 508.

The mixer core 502 includes DACs 510 and 512, a local oscillator (or synthesizer circuitry) 514, mixers 516 and 518, an adder 520. The PA 506 can include a neutralized differential pair of transistors 522. The matching circuitry 504 can be configured as a transformer coupling the output of the mixer core 502 (e.g., a differential analog signal generated by mixers 516 and 518) to the input of PA 506. In this regard, the transformer of the matching circuitry 504 can be used for driving the PA 506 by the differential signal output of mixer core 502. The output of PA 506 is output to at least one antenna via the single-ended balun 508.

Figure 6:
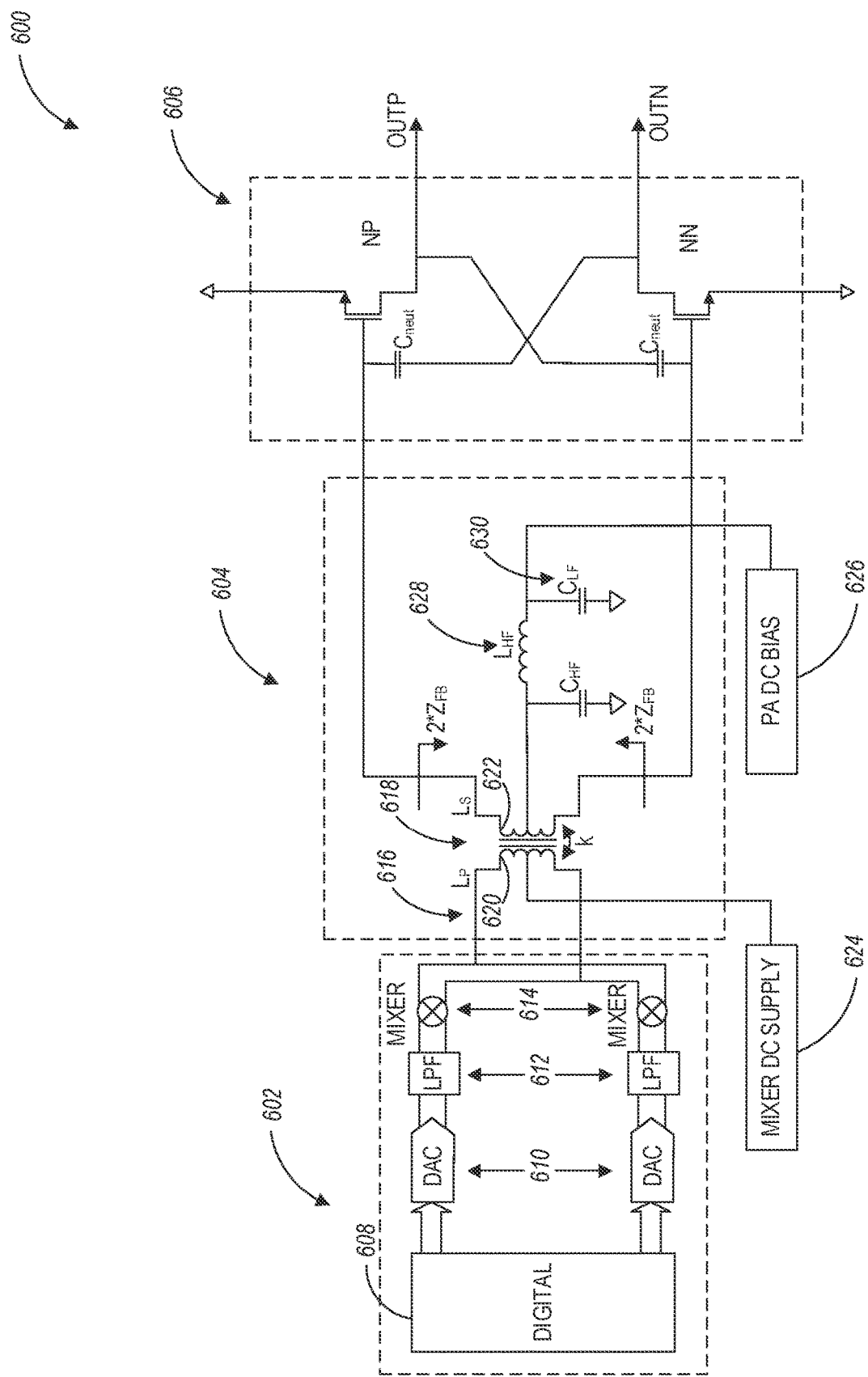
FIG. 6 illustrates a block diagram of a more detailed view of the RF circuitry of FIG. 5, in accordance with some embodiments.

FIG. 6 illustrates a block diagram of a more detailed view of the RF circuitry of FIG. 5, in accordance with some embodiments. Referring to FIG. 6, RF circuitry 600 includes mixer core 602, matching circuitry 604, and PA 606. Mixer core 602 can include a digital signal processor 608 (e.g., a baseband processor such as TX baseband processor 404 in baseband processing circuitry 400 of FIG. 4), DACs 610 (e.g., DAC 408), low-pass filters (LPFs) 612 (e.g., filter circuitry 312 of FIG. 3), and mixers 614 (e.g., mixer circuitry 314 in FIG. 3). Mixers 614 are configured to upconvert an RF signal using an LO signal (e.g., LO signal generated by synthesizer circuitry 304). Matching circuitry 604 includes transformer 618 and HT circuit 628 (which can be the same as HT circuit 105 discussed previously). Transformer 618 can be a differential input transformer used for driving PA 606 via the differential baseband signal 616 generated as output by the mixer core 602. PA 606 includes differential pair of transistors NN and NP generating signal outputs OutN and OutP. PA 606 further includes neutralization capacitors Cneut couple to the gates of transistors NN and NP.

In an example embodiment, transformer 618 includes a primary inductor 620 coupled to the mixer core 602 and a secondary inductor 622 coupled to the input of PA 606. A mixer DC supply 624 can be coupled to the primary inductor 620, and a DC bias voltage source 626 can be coupled to the secondary inductor 622.

In an example embodiment, HT circuit 628 is coupled between the DC bias voltage source 626 and the secondary inductor 622 and is configured to filter out one or more harmonics of the LO signal used to generate the differential baseband signal 616. In some aspects, the HT circuit 628 is configured as a filter arrangement including at least one L-C filter (e.g., inductor $L_{HF}$ and capacitor $C_{HF}$) for filtering out one or more harmonics of the LO signal, such as an even-order harmonic (e.g., the fourth harmonic of the LO signal). In an example embodiment, HT circuit 628 further includes a grounded capacitor CL 630 configured to filter low-frequency noise signals generated by the DC bias voltage source 626.

In some embodiments associated with an RF direct conversion topology transceiver (e.g., including circuit topologies illustrated in FIG. 5 in FIG. 6), a 90° phase-shifted I and Q differential baseband signal (e.g., differential baseband signal 616) is generated and upconverted using an RF signal generated using an LO signal. To improve the overall noise rejection of the RF circuitry 600, the RF line-up can be designed in differential mode up to the final antenna interface, where a differential-to-single-ended balun (e.g., balun 508) is used. Due to the differential nature of IQ mixing with differential LO frequency, even-order harmonics of the LO will be generated. In low-frequency wireless systems (usually below 10 GHz), the 4th order harmonic noise power ends up generating a spur at the main channel for mmWave applications (e.g., 5G and beyond). The source of this elevated LO 4th order harmonic spur is coming from the common-mode (CM) feedback noise coupling on the DC bias for the PA 606 that is driven by the mixer core 602, as shown in FIG. 6. In some aspects, this issue may be addressed by inserting a high decoupling capacitor at the center tap node of the secondary inductor 622 to short this high-frequency noise to the ground. However, this high-value capacitor, along with the addition of the differential pair parasitic capacitance, creates a low-frequency pole when resonating with the transformer inductors, causing a higher potential for PA instability and oscillation at common-mode.

The common-mode noise generated by the feedback ends up modulating the bias node since the impedance looking from the PA input into the DC-bias node is very high, hence the noise is directly fed at the PA input and gets amplified by the PA 606. Although the gain of the PA 606 is low at the 4th harmonic frequency region, the power level of the spur is high.

In some embodiments, to reduce the power of the LO 4th order harmonic spur, HT circuit 628 can be used. More specifically, HT circuit 628 can be configured as an LC filter at the center tap of the secondary inductor 622 of transformer 618, as shown in FIG. 6. In some embodiments, the added LC filter can be designed to meet resonate at the 4th order harmonic of the LO ($\omega_{o4}$). However, adding this LC filter could introduce a potential instability to PA 606 due to the feedback nature of the PA which is caused by the gate-drain capacitance (Cgd) and the neutralization capacitor (Cneut) in common mode. The design flow is explained hereinbelow.

Figure 8:
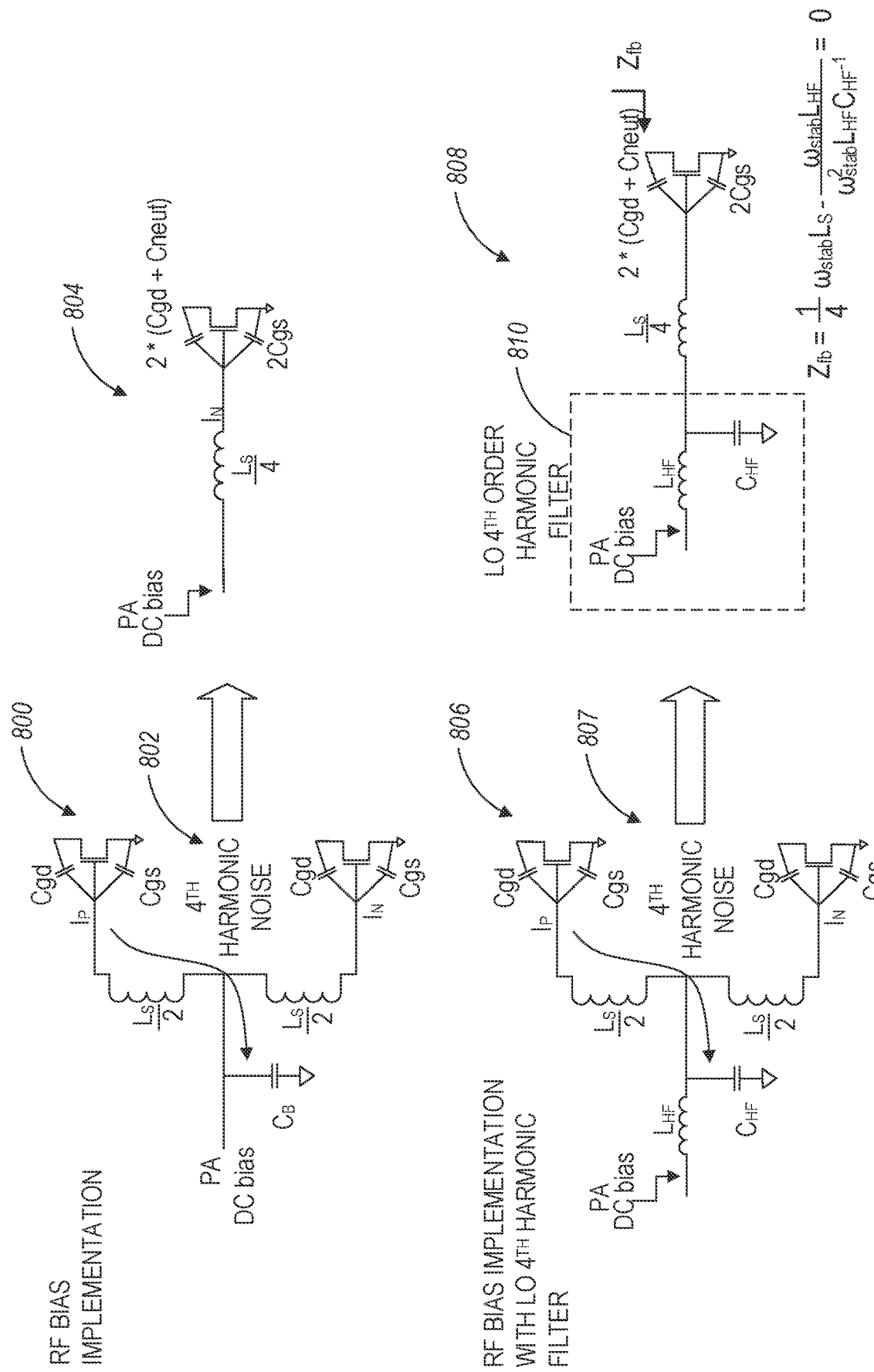
FIG. 8 illustrates a block diagram of RF bias implementations in connection with the RF circuitry of FIG. 5, in accordance with some embodiments.
Figure 9:
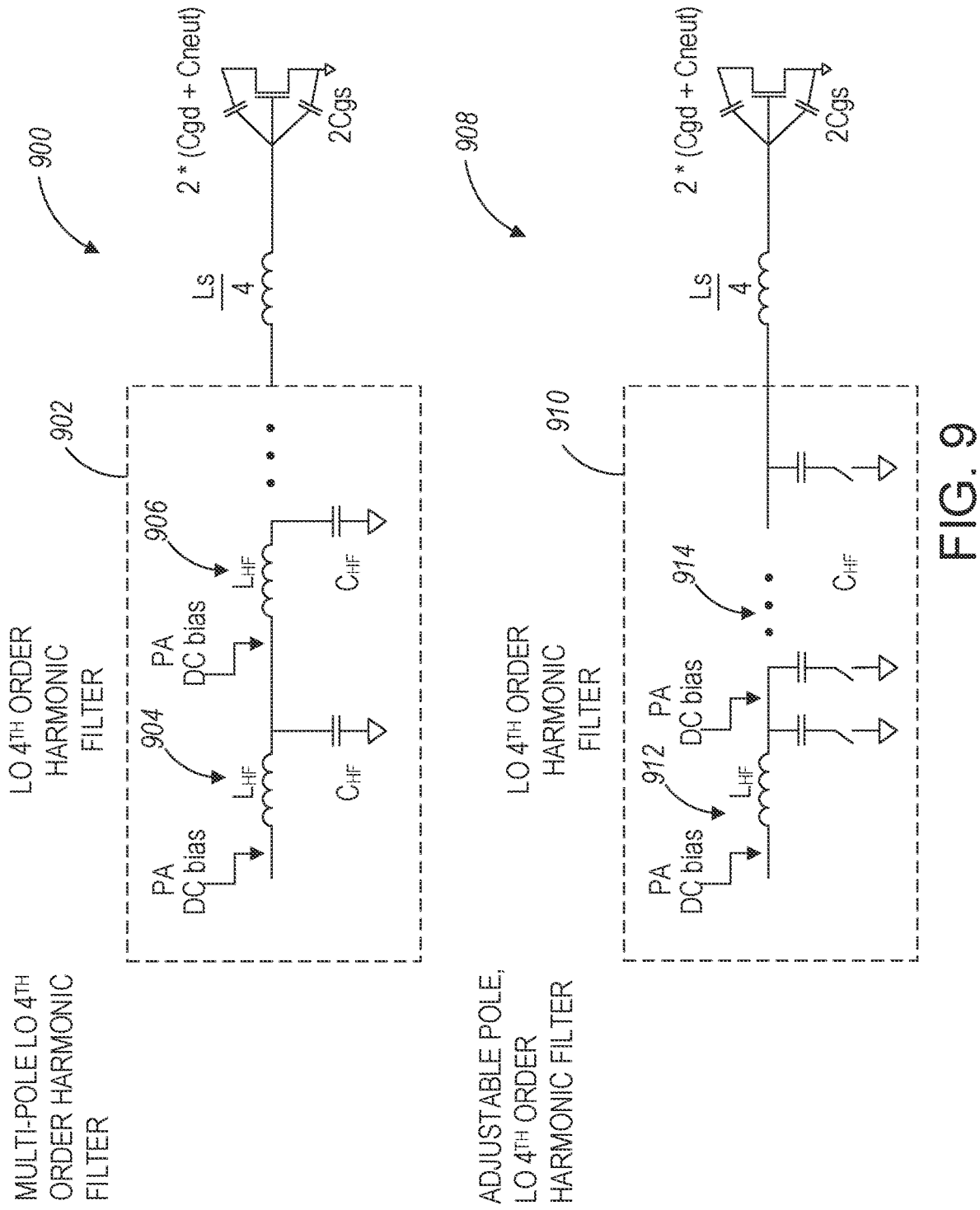
FIG. 9 illustrates a block diagram of RF bias implementations in connection with the RF circuitry of FIG. 5, including multi-pole and adjustable pole harmonic filters, in accordance with some embodiments.
Figure 10:
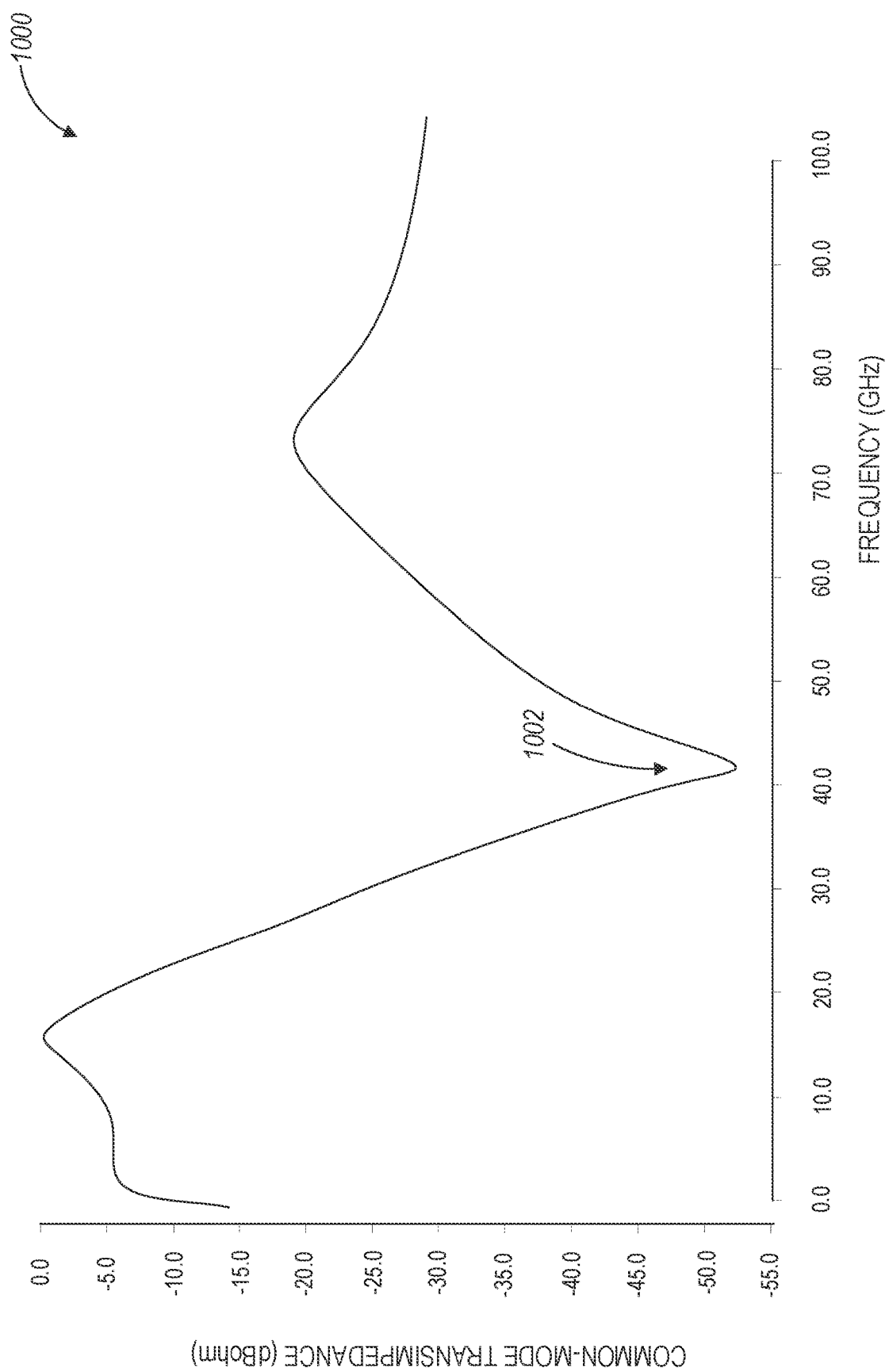
FIG. 10 is a graph of common-mode trans-impedance showing the effect of a harmonic rejection filter, in accordance with some embodiments.

Since the inductor $L_{HF}$ of the L-C filter in HT circuit 628 is designed to address the 4th harmonic frequency of the LO, its value will be smaller compared to the interstage transformer inductor. Hence, such an inductor can be implemented within the interstage transformer matching, as shown in FIGS. 6, 8, and 9. The quality factor of the filter inductor can be designed to be low to ensure no peaking is introduced at a lower frequency, where this inductor can resonate with the total decoupling capacitance of the RF bias in addition to the increased parasitic PA capacitance at common-mode. The disclosed filter arrangement as HT circuit 628 allows over 45 dB of noise rejection at the 4th LO harmonic spur, as shown in FIG. 10.

In some aspects, when designing the LO 4th harmonic rejection filter of the HT circuit 628, filter behavior at the LO designed frequency vs. the LO 4th harmonic frequency can be considered. Considerations for both stability and common-mode rejection are a performance tradeoff. Example L-C filter design can start with the assumption that stability has a critical priority. The stability is the main issue that existing solutions cannot implement a high decoupling capacitance at the center tap node, since it will resonate with the transformer inductance at a much lower frequency than LO, creating potential instability. To avoid a significant size decoupling capacitor for noise reduction, the HT circuit 628 can further include an inductor between the decoupling capacitor and the bias circuit to ensure PA stability while significantly reducing LO 4th harmonic common-mode noise. In some aspects, the feedback impedance at $\omega_{o4}$ (or the frequency at the LO 4th harmonic) is designed to meet 0Ω, insuring all the CM feedback noise is shorted at this impedance to ground.

In some embodiments, an inductor value of approximately 400 pH for $L_{HF}$ can be used at the secondary inductor 622 center-tap of the inter-stage matching. In some aspects, the inductance value is determined by simulations and determining an optimal tradeoff between PA stability and harmonic noise rejection. In some aspects, a decoupling capacitor $C_{HF}$ is added at the center-tap of inter-stage matching as well, with a capacitance value also determined by the above analysis. In some aspects, the decoupling capacitor re-tunes at the DC bias provided by the DC bias voltage source 626.

Figure 7:
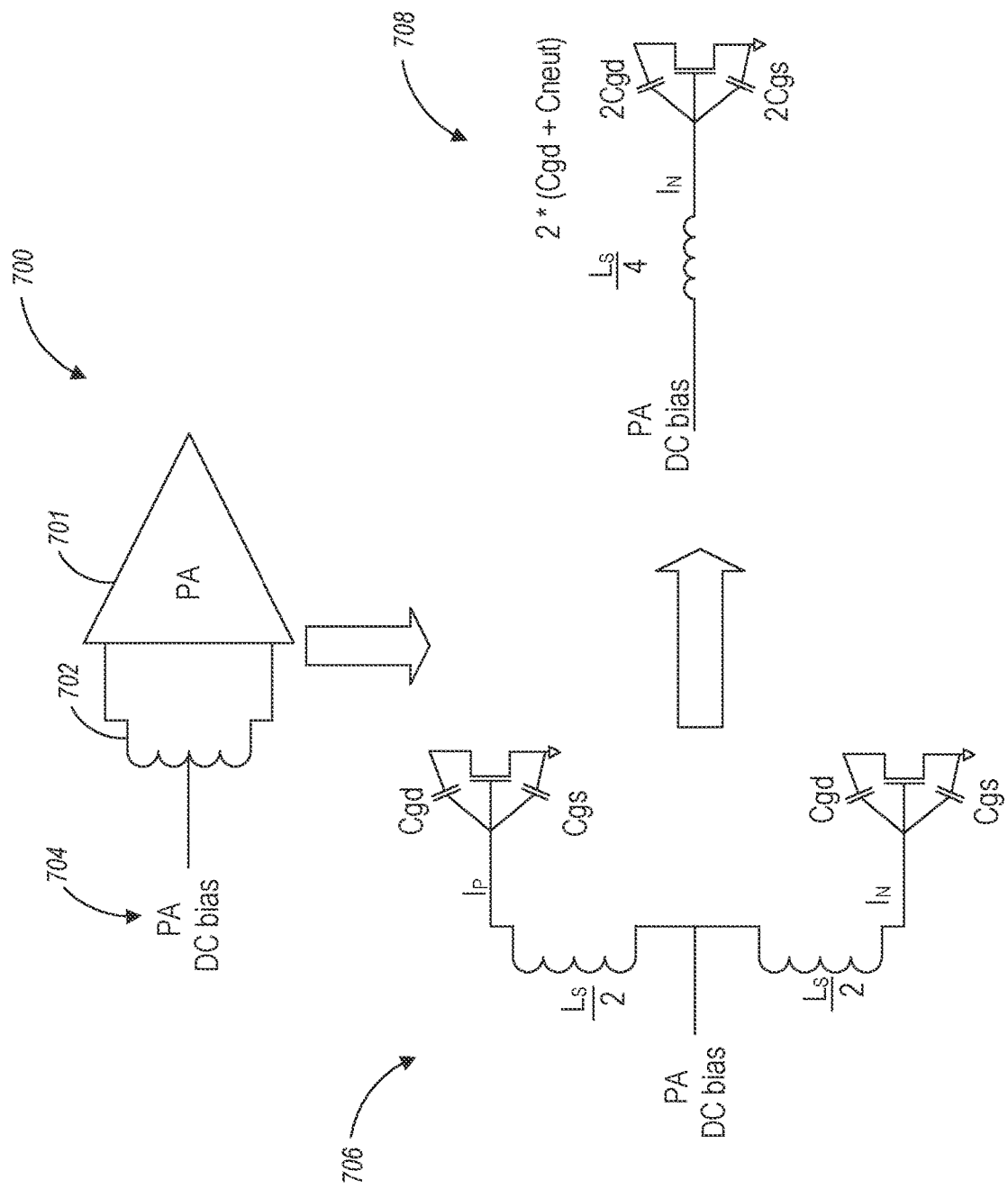
FIG. 7 illustrates a block diagram of PA input impedance at common mode, in accordance with some embodiments.

FIG. 7 illustrates a block diagram 700 of PA input impedance at common mode, in accordance with some embodiments. Referring to FIG. 7, PA 701 receives DC bias voltage 704 via a center tap of the secondary inductor 702. Diagrams 706 and 708 illustrate the input impedance of PA 701, where Ls is the inductance of the secondary inductor 702, $C_{GD}$ is the gate-drain capacitance, $C_{GS}$ is the gate-source capacitance, and Cneut is the neutralization capacitance of PA 701.

FIG. 8 illustrates a block diagram of RF bias implementations in connection with the RF circuitry of FIG. 5, in accordance with some embodiments. Referring to FIG. 8, diagrams 800 and 804 illustrate that the PA receives DC bias voltage, with resulting LO $4^{th}$ order harmonic noise 802 being mitigated by the bias capacitor Ca.

Diagrams 806 and 808 illustrate that the PA receives DC bias voltage, with resulting LO $4^{th}$ order harmonic noise 807 being mitigated by the L-C filter 810 formed by $L_{HF}$ and $C_{HF}$.

Figure 13:
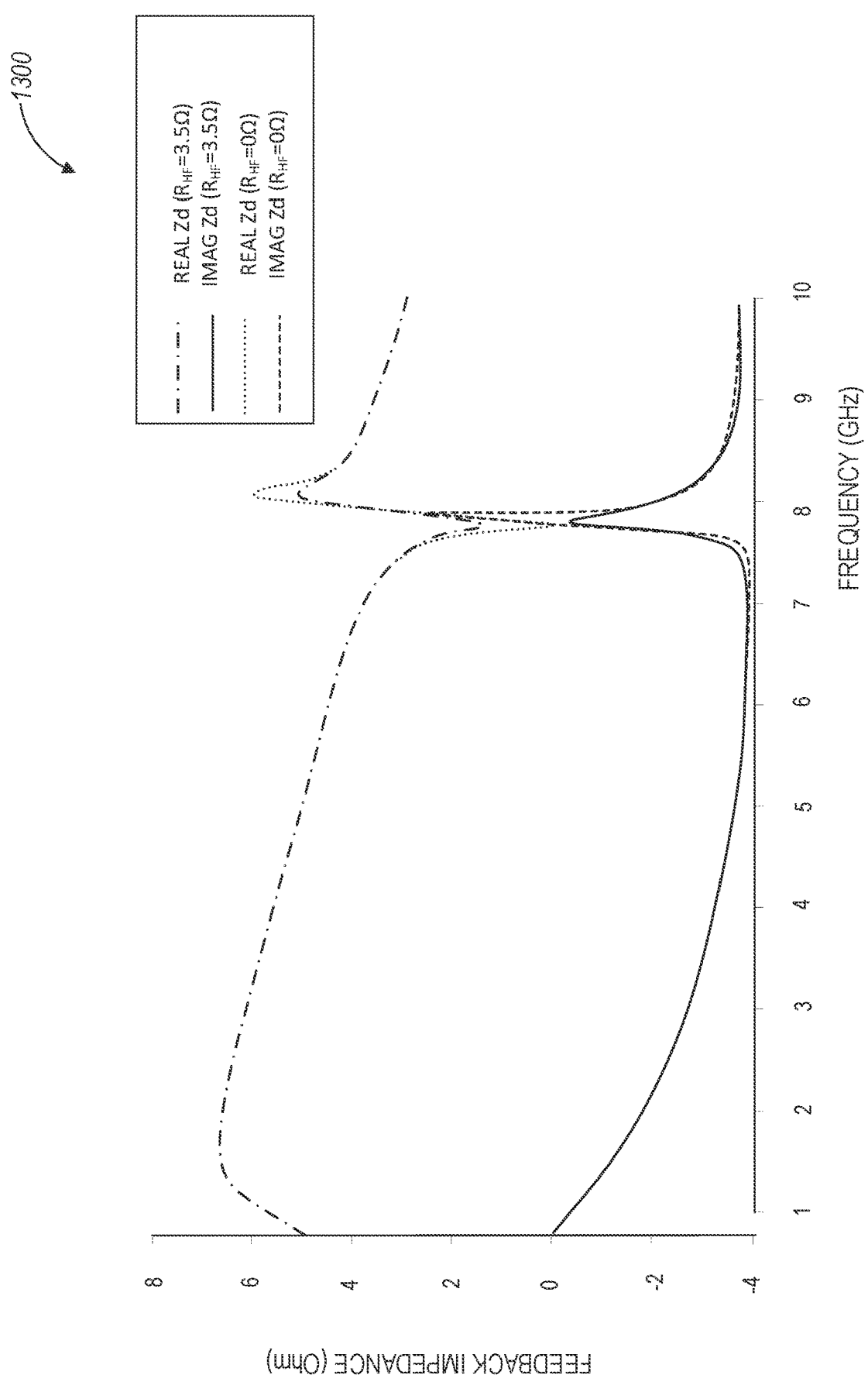
FIG. 13 is a graph of simulated common-mode feedback impedance (Zd) associated with the RF circuitry in FIG. 12, in accordance with some embodiments.

In some embodiments, the following equations can be used for configuring the inductance and capacitance of $L_{HF}$ and $C_{HF}$.

$$L_{HF}C_{HF} = \frac{1}{\omega_{o4}^2} \text{ and} \qquad (1)$$

$$Z_{fb} = \frac{1}{4}\omega_{stab}L_s - \frac{\omega_{stab}L_{HF}}{\omega_{stab}^2 L_{HF}C_{HF} - 1} = 0, \qquad (2)$$

where $\omega_{o4}$ is the frequency of the LO $4^{th}$ order harmonic, $\omega_{stab}$ is the stability frequency (e.g., the frequency for the weakest stability, which can be the smallest of the positive real part of the common-mode feedback impedance). The real part of the feedback impedance (which is also illustrated in FIG. 13) can be configured as a positive value to keep the impedance stable.

From equations (1) and (2), the following equations for the inductance and capacitance of the L-C filter 810 can be derived:

$$L_{HF} = \frac{L_s}{4\left(\frac{\omega_{stab}^2}{\sigma_{o4}^2} - 1\right)} \text{ and} \qquad (3)$$

$$C_{HF} = \frac{1}{\omega_{o4}^2 L_{HF}}. \qquad (4)$$

For example, the inductance of the secondary inductor 622 of transformer 618 can be configured as $L_s$=2.0 nH, the 4th order harmonic is at 42 GHz, and the stabilized frequency can be designed to be 63 GHz. From equation (3), $L_{HF}$=424 pH. From equation (4), the $C_{HF}$ has the value of 33.9 fF.

FIG. 9 illustrates block diagrams 900 and 908 of RF bias implementations in connection with the RF circuitry of FIG. 5, including multi-pole and adjustable pole harmonic filters, in accordance with some embodiments. Referring to FIG. 9, diagram 900 illustrates filter arrangement 902 configured as multi-pole LO $4^{th}$ order harmonic filter comprising multiple L-C filters 904, 906, etc. Diagram 908 illustrates filter arrangement 910 configured as an adjustable pole LO $4^{th}$ order harmonic filter comprising a single inductor 912 with multiple, switchable unit capacitors 914.

FIG. 10 is a graph 1000 of common-mode trans-impedance showing the effect of a harmonic rejection filter, in accordance with some embodiments. As illustrated in FIG. 10, HT circuit 105 can be configured to provide harmonic rejection 1002 at a preconfigured frequency (e.g., 42 GHz) with over 40 dB attenuation.

Figure 11:
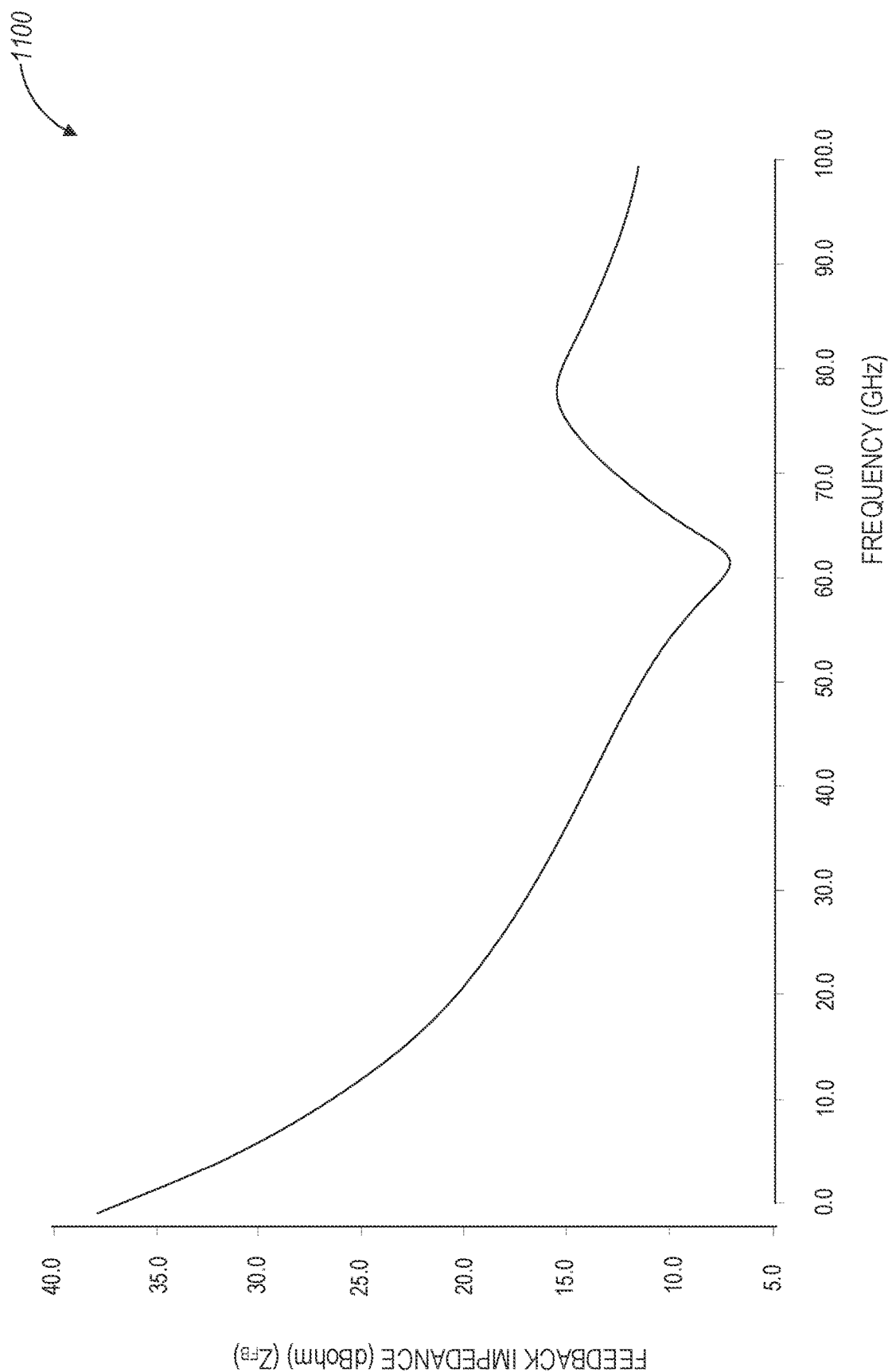
FIG. 11 is a graph of feedback impedance showing the effect of a harmonic rejection filter, in accordance with some embodiments.

FIG. 11 is graph 1100 of the feedback impedance $Z_{FB}$ showing the effect of a harmonic rejection filter, in accordance with some embodiments.

Figure 12:
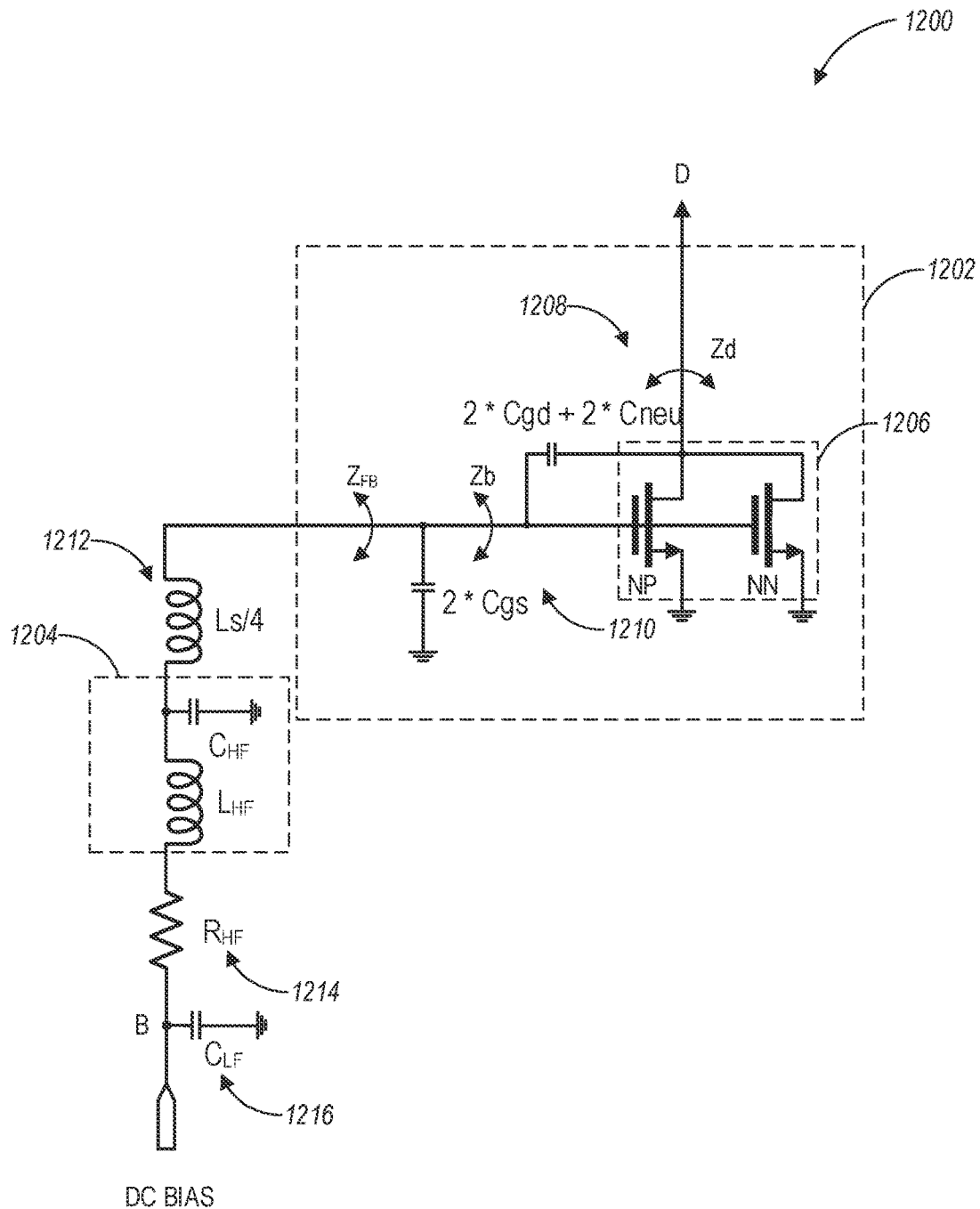
FIG. 12 is a diagram illustrating common-mode feedback impedance at the PA of the RF circuitry of FIG. 6, in accordance with some embodiments.

FIG. 12 is a diagram 1200 illustrating common-mode feedback impedance at the PA 1202 of RF circuitry (e.g., the RF circuitry of FIG. 6), in accordance with some embodiments. More specifically, FIG. 12 shows the common-mode feedback impedance at node D of PA 1202, which is at the drain terminals of transistor pair 1206 (e.g., transistors NP and NN). Filter 1204 is configured as a LO 4th order harmonic blocking tank, formed by $C_{HF}$ and $L_{HF}$. Inductor 1212 is the equivalent inductor formed by the inductance Ls of the secondary inductor 622 of transformer 618.

$Z_{FB}$ is the common-mode impedance looking back into the balun output node of PA 1202. Capacitance Cgs is the parasitic capacitance of the gate and source terminals of NP or NN, and Cgd is the parasitic capacitance of the gate and drain terminals of NP or NN. Cneut is the neutralization capacitance of the power amplifier transconductance stage. Capacitor 1216 $C_{LF}$ is the DC bias low-frequency noise filtering capacitor.

Cgd' (combined Cgd and Cneut, Cgd'=Cgd+Cneu) forms feedback from the drain terminals of NP and NN to the gate terminals of NP and NN and may cause instability. To investigate the stability, the impedance 1208 looking into the drain of NP and NN (Zd) is derived in Equation (5) below. The oscillation occurs when the real part of Zd is negative and the imaginary part of Zd crosses zero. Matlab simulation can be used to illustrate that $R_{HF}$ 1214 can be added to improve stability.

FIG. 13 is a graph 1300 of simulated common-mode feedback impedance (Zd) associated with the RF circuitry in FIG. 12, in accordance with some embodiments.

If $R_{HF}$=0, as shown in FIG. 13, the feedback impedance is unstable around 80 GHz. If $R_{HF}$=3.5 Ohm, which is parasitic resistance of $L_{HF}$ combined with an in-series designed resistor (total is $R_{HF}$), it becomes stable as shown in FIG. 13.

The following equations may be used for configuring $R_{HF}$:

$$Z_d = 0.5 \frac{0.5 + sC'_{gd}Z_b}{sC'_{gd}(0.5 + Z_b g_m)} = \frac{0.5}{sC'_{gd}} \cdot \frac{0.5 G_b + sC'_{gd}}{0.5 G_b + g_m}, \qquad (5)$$

where $Z_b$ 1210 is the $Z_{FB}$ parallel with the capacitor $C_{gs}$. Additionally, $$Z_b = \frac{Z_{FB}}{1 + 2sC_{gs}Z_{FB}} \text{ and} \qquad (6)$$

$$G_b = \frac{1}{Z_b},$$

where s is the Laplace variable and $g_m$ is the transconductance of transistor pair 1206.

In this regard, Equation (5) can be used to perform the Zd simulation by Matlab, and then select a small value for $R_{HF}$ to let the real part of Zd be positive (as shown in FIG. 13). The positive real part of Zd keeps the circuit stable. The reason to select a small value of $R_{HF}$ (e.g., below a threshold established by simulation) is to keep the quality factor of the filter tank (e.g., HT circuit 628) formed by $L_{HF}$ and $C_{HF}$ optimal so it reduces the common-mode LO 4th harmonic noise.

Figure 14:
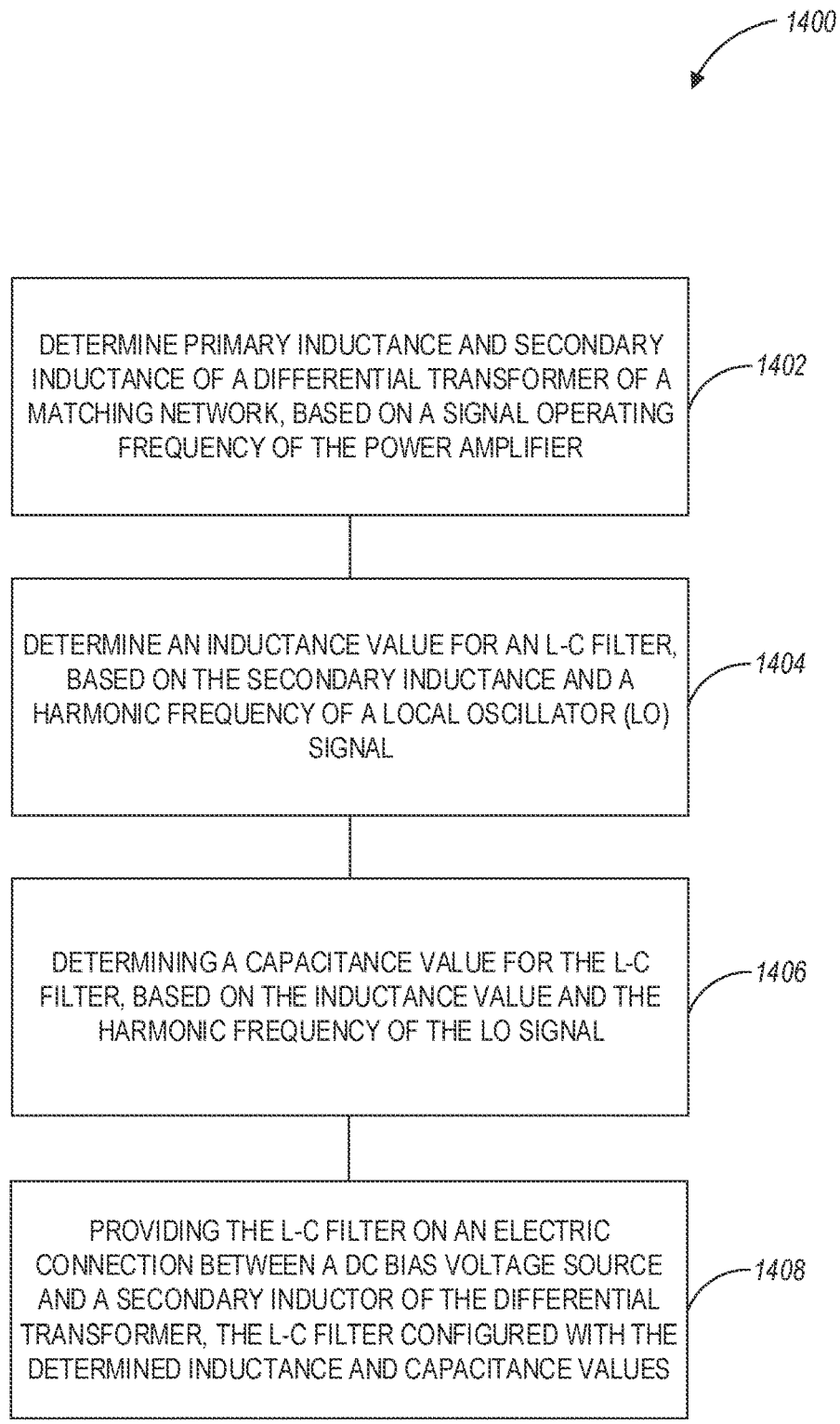
FIG. 14 illustrates a flow diagram of a method for harmonic trapping in a matching network of a power amplifier, in accordance with some embodiments.

FIG. 14 illustrates a flow diagram of a method 1400 for harmonic trapping in a matching network of a power amplifier, in accordance with some embodiments. Referring to FIG. 14, method 1400 includes operations 1402, 1404, 1406, and 1408, which may be executed by control circuitry of a wireless device (e.g., hardware processor 1502 of machine 1500 illustrated in FIG. 15).

At operation 1402, the primary inductance and secondary inductance of a differential transformer of the matching network are determined, based on a signal operating frequency of the power amplifier. For example, primary inductance Lp and secondary inductors Ls are determined for corresponding primary inductor 620 and secondary inductor 622 of transformer 618.

At operation 1404, an inductance value for an L-C filter is determined, based on the secondary inductance and a harmonic frequency of a local oscillator (LO) signal. For example and about Equations (1)-(4) above, $L_{HF}$ can be determined based on Ls, the stabilized frequency, and the LO $4^{th}$ order harmonic frequency.

At operation 1406, a capacitance value for the L-C filter is determined, based on the inductance value and the harmonic frequency of the LO signal. For example and about Equations (1)-(4) above, $C_{HF}$ can be determined based on $L_{HF}$ and the LO $4^{th}$ order harmonic frequency.

At operation 1408, the L-C filter is provided on an electric connection between a direct current (DC) bias voltage source and a secondary inductor of the differential transformer. For example, the L-C filter of HT circuit 628 is configured on the electric connection between the DC bias voltage source 626 and the secondary inductor 622 of transformer 618. The L-C filter can be configured with the determined inductance value and the determined capacitance value.

Figure 15:
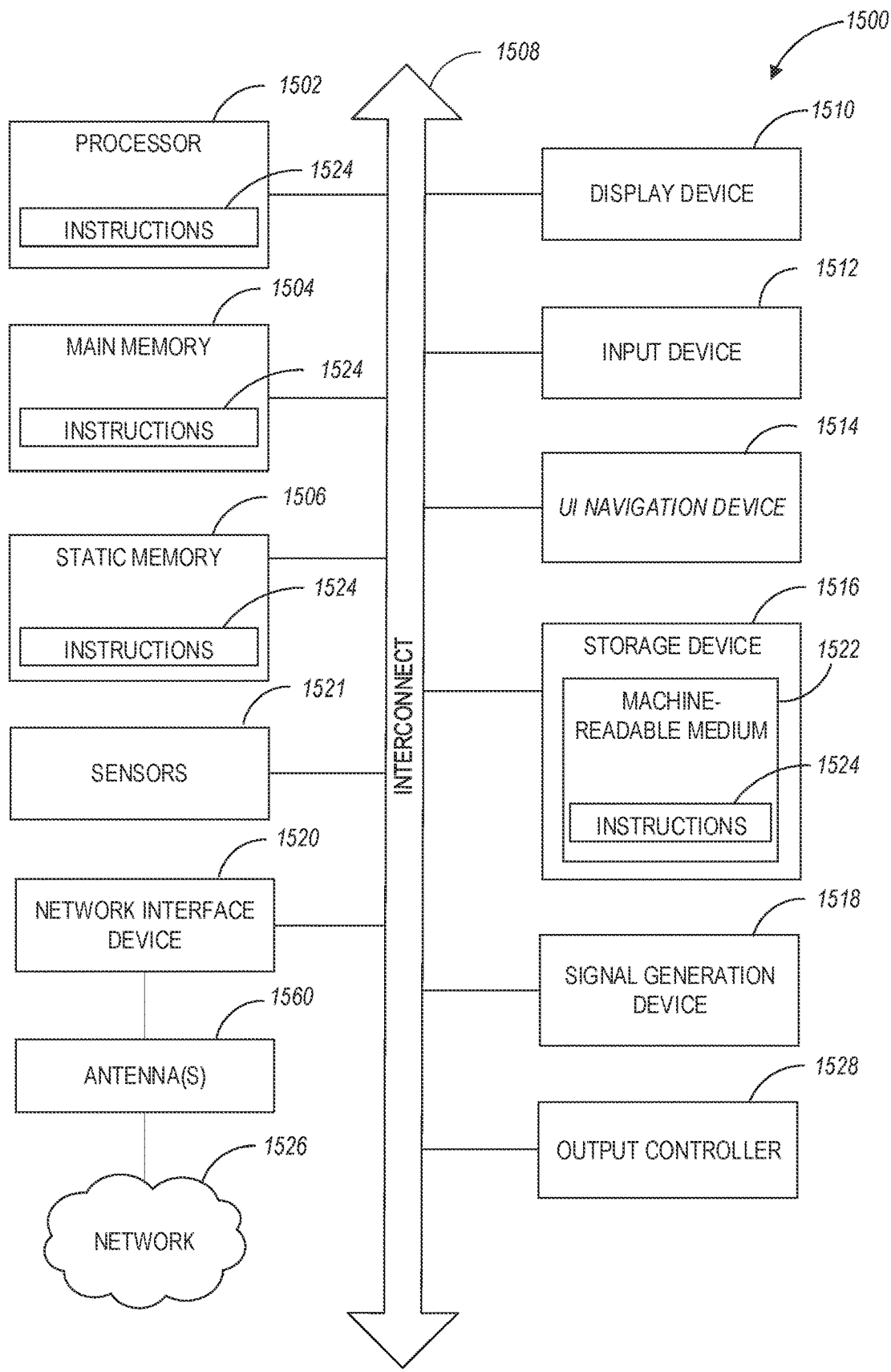
FIG. 15 illustrates a block diagram of an example machine upon which any one or more of the operations/techniques (e.g., methodologies) discussed herein may perform.

FIG. 15 illustrates a block diagram of an example machine 1500 upon which any one or more of the techniques (e.g., methodologies) discussed herein may perform. In alternative embodiments, the machine 1500 may operate as a standalone device or may be connected (e.g., networked) to other machines. In a networked deployment, machine 1500 may operate in the capacity of a server machine, a client machine, or both in server-client network environments. In an example, the machine 1500 may act as a peer machine in a peer-to-peer (P2P) (or other distributed) network environment. The machine 1500 may be a personal computer (PC), a tablet PC, a set-top box (STB), a personal digital assistant (PDA), a portable communications device, a mobile telephone, a smartphone, a web appliance, a network router, switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Machine (e.g., computer system) 1500 may include a hardware processor 1502 (e.g., a central processing unit (CPU), a graphics processing unit (GPU), a hardware processor core, or any combination thereof), a main memory 1504, and a static memory 1506, some or all of which may communicate with each other via an interlink (e.g., bus) 1508.

Specific examples of main memory 1504 include Random Access Memory (RAM), and semiconductor memory devices, which may include, in some embodiments, storage locations in semiconductors such as registers. Specific examples of static memory 1506 include non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; RAM, and CD-ROM and DVD-ROM disks.

Machine 1500 may further include a display device 1510, an input device 1512 (e.g., a keyboard), and a user interface (UI) navigation device 1514 (e.g., a mouse). In an example, the display device 1510, input device 1512, and UI navigation device 1514 may be a touch screen display. The machine 1500 may additionally include a storage device (e.g., drive unit or another mass storage device) 1516, a signal generation device 1518 (e.g., a speaker), a network interface device 1520, and one or more sensors 1521, such as a global positioning system (GPS) sensor, compass, accelerometer, or other sensors. The machine 1500 may include an output controller 1528, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.). In some embodiments, the processor 1502 and/or instructions 1524 may comprise processing circuitry and/or transceiver circuitry.

The storage device 1516 may include a machine-readable medium 1522 on which is stored one or more sets of data structures or instructions 1524 (e.g., software) embodying or utilized by any one or more of the techniques or functions described herein. The instructions 1524 may also reside, completely or at least partially, within the main memory 1504, within static memory 1506, or within the hardware processor 1502 during execution thereof by the machine 1500. In an example, one or any combination of the hardware processor 1502, the main memory 1504, the static memory 1506, or the storage device 1516 may constitute machine-readable media.

Specific examples of machine-readable media may include non-volatile memory, such as semiconductor memory devices (e.g., EPROM or EEPROM) and flash memory devices; magnetic disks, such as internal hard disks and removable disks; magneto-optical disks; RAM; and CD-ROM and DVD-ROM disks.

While the machine-readable medium 1522 is illustrated as a single medium, the term "machine-readable medium" may include a single medium or multiple media (e.g., a centralized or distributed database, and/or associated caches and servers) configured to store one or more instructions 1524.

An apparatus of the machine 1500 may be one or more of a hardware processor 1502 (e.g., a central processing unit (CPU), a graphics processing unit (GPU), a hardware processor core, or any combination thereof), a main memory 1504 and a static memory 1506, one or more sensors 1521, a network interface device 1520, antennas 1560, a display device 1510, an input device 1512, a UI navigation device 1514, a storage device 1516, instructions 1524, a signal generation device 1518, and an output controller 1528. The apparatus may be configured to perform one or more of the methods and/or operations disclosed herein. The apparatus may be intended as a component of the machine 1500 to perform one or more of the methods and/or operations disclosed herein, and/or to perform a portion of one or more of the methods and/or operations disclosed herein. In some embodiments, the apparatus may include a pin or other means to receive power. In some embodiments, the apparatus may include power conditioning hardware.

The term "machine-readable medium" may include any medium that is capable of storing, encoding, or carrying instructions for execution by the machine 1500 and that cause the machine 1500 to perform any one or more of the techniques of the present disclosure, or that is capable of storing, encoding or carrying data structures used by or associated with such instructions. Non-limiting machine-readable medium examples may include solid-state memories and optical and magnetic media. Specific examples of machine-readable media may include non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; Random Access Memory (RAM); and CD-ROM and DVD-ROM disks. In some examples, machine-readable media may include non-transitory machine-readable media. In some examples, machine-readable media may include machine-readable media that is not a transitory propagating signal.

The instructions 1524 may further be transmitted or received over a communications network 1526 using a transmission medium via the network interface device 1520 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, a Long Term Evolution (LTE) family of standards, a Universal Mobile Telecommunications System (UMTS) family of standards, peer-to-peer (P2P) networks, among others.

In an example, the network interface device 1520 may include one or more physical jacks (e.g., Ethernet, coaxial, or phone jacks) or one or more antennas to connect to the communications network 1526. In an example, the network interface device 1520 may include one or more antennas 1560 to wirelessly communicate using at least one single-input multiple-output (SIMO), multiple-input multiple-output (MIMO), or multiple-input single-output (MISO) techniques. In some examples, the network interface device 1520 may wirelessly communicate using Multiple User MIMO techniques. The term "transmission medium" shall be taken to include any intangible medium that is capable of storing, encoding, or carrying instructions for execution by the machine 1500, and includes digital or analog communications signals or other intangible media to facilitate communication of such software.

Examples, as described herein, may include, or may operate on, logic or a number of components, modules, or mechanisms. Modules are tangible entities (e.g., hardware) capable of performing specified operations and may be configured or arranged in a certain manner. In an example, circuits may be arranged (e.g., internally or concerning external entities such as other circuits) in a specified manner as a module. In an example, the whole or part of one or more computer systems (e.g., a standalone, client, or server computer system) or one or more hardware processors may be configured by firmware or software (e.g., instructions, an application portion, or an application) as a module that operates to perform specified operations. In an example, the software may reside on a machine-readable medium. In an example, the software, when executed by the underlying hardware of the module, causes the hardware to perform the specified operations.

Accordingly, the term "module" is understood to encompass a tangible entity, be that an entity that is physically constructed, specifically configured (e.g., hardwired), or temporarily (e.g., transitorily) configured (e.g., programmed) to operate in a specified manner or to perform part or all of any operation described herein. Considering examples in which modules are temporarily configured, each of the modules need not be instantiated at any one moment in time. For example, where the modules comprise a general-purpose hardware processor configured using the software, the general-purpose hardware processor may be configured as respective different modules at different times. The software may accordingly configure a hardware processor, for example, to constitute a particular module at one instance of time and to constitute a different module at a different instance of time.

Some embodiments may be implemented fully or partially in software and/or firmware. This software and/or firmware may take the form of instructions contained in or on a non-transitory computer-readable storage medium. Those instructions may then be read and executed by one or more processors to enable the performance of the operations described herein. The instructions may be in any suitable form, such as but not limited to source code, compiled code, interpreted code, executable code, static code, dynamic code, and the like. Such a computer-readable medium may include any tangible non-transitory medium for storing information in a form readable by one or more computers, such as but not limited to read-only memory (ROM); random access memory (RAM); magnetic disk storage media, optical storage media; flash memory, etc.

The above-detailed description includes references to the accompanying drawings, which form a part of the detailed description. The drawings show, by way of illustration, specific embodiments that may be practiced. These embodiments are also referred to herein as "examples." Such examples may include elements in addition to those shown or described. However, also contemplated are examples that include the elements shown or described. Moreover, also contemplated are examples using any combination or permutation of those elements shown or described (or one or more aspects thereof), either with respect to a particular example (or one or more aspects thereof) or with respect to other examples (or one or more aspects thereof) shown or described herein.

Publications, patents, and patent documents referred to in this document are incorporated by reference herein in their entirety, as though individually incorporated by reference. In the event of inconsistent usages between this document and those documents so incorporated by reference, the usage in the incorporated reference(s) are supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels and are not intended to suggest a numerical order for their objects.

The embodiments as described above may be implemented in various hardware configurations that may include a processor for executing instructions that perform the techniques described. Such instructions may be contained in a machine-readable medium such as a suitable storage medium or a memory or other processor-executable medium.

The embodiments as described herein may be implemented in a number of environments such as part of a wireless local area network (WLAN), 3rd Generation Partnership Project (3GPP) Universal Terrestrial Radio Access Network (UTRAN), or Long-Term-Evolution (LTE) or a Long-Term-Evolution (LTE) communication system, although the scope of the disclosure is not limited in this respect.

Antennas referred to herein may comprise one or more directional or omnidirectional antennas, including, for example, dipole antennas, monopole antennas, patch antennas, loop antennas, microstrip antennas, or other types of antennas suitable for transmission of RF signals. In some embodiments, instead of two or more antennas, a single antenna with multiple apertures may be used. In these embodiments, each aperture may be considered a separate antenna. In some multiple-input multiple-output (MIMO) embodiments, antennas may be effectively separated to take advantage of spatial diversity and the different channel characteristics that may result between each of antennas and the antennas of a transmitting station. In some MIMO embodiments, antennas may be separated by up to $\frac{1}{10}$ of a wavelength or more.

Described implementations of the subject matter can include one or more features, alone or in combination as illustrated below by way of examples.

Example 1 is an apparatus for a communication device, the apparatus comprising: baseband circuitry to generate a differential baseband signal using a local oscillator (LO) signal; matching circuitry, comprising: a transformer to receive the differential baseband signal and generate a transformed signal based on the differential baseband signal; and a direct current (DC) bias voltage source, the DC bias voltage source coupled to the transformer via a filter arrangement; and amplification circuitry to amplify the transformed signal.

In Example 2, the subject matter of Example 1 includes subject matter where the filter arrangement is configured to filter out an even-order harmonic of the LO signal from the transformed signal.

In Example 3, the subject matter of Examples 1-2 includes subject matter where the filter arrangement is configured to filter out a fourth-order harmonic of the LO signal from the transformed signal.

In Example 4, the subject matter of Examples 1-3 includes subject matter where the filter arrangement is an L-C filter.

In Example 5, the subject matter of Example 4 includes subject matter where the L-C filter is configured with capacitance and inductance values resulting in a rejection frequency associated with a fourth-order harmonic of the LO signal.

In Example 6, the subject matter of Examples 1-5 includes subject matter where the transformer comprises a primary inductor and a secondary inductor, and wherein the DC bias voltage source is coupled to the secondary inductor via an electric connection including the filter arrangement.

In Example 7, the subject matter of Example 6 includes subject matter where the electric connection couples the DC bias voltage source and a center tap of the secondary inductor.

In Example 8, the subject matter of Examples 1-7 includes a grounded capacitor, the grounded capacitor coupled between the filter arrangement and the DC voltage source.

In Example 9, the subject matter of Example 8 includes subject matter where the grounded capacitor is configured to filter low-frequency noise signals generated by the DC bias voltage source.

In Example 10, the subject matter of Examples 1-9 includes subject matter where the filter arrangement comprises a single inductor and a plurality of switchable unit capacitors.

Example 11 is a method for harmonic trapping in a matching network of a power amplifier, the method comprising: determining primary inductance and secondary inductance of a differential transformer of the matching network, based on a signal operating frequency of the power amplifier; determining an inductance value for an L-C filter, based on the secondary inductance and a harmonic frequency of a local oscillator (LO) signal; determining a capacitance value for the L-C filter, based on the inductance value and the harmonic frequency of the LO signal; and providing the L-C filter on an electric connection between a direct current (DC) bias voltage source and a secondary inductor of the differential transformer, the L-C filter configured with the determined inductance value and the determined capacitance value.

In Example 12, the subject matter of Example 11 includes, determining the inductance value further based on a stability frequency, the stability frequency corresponding to a minimal positive real part of a common-mode feedback impedance of the power amplifier.

In Example 13, the subject matter of Example 12 includes, coupling the electric connection between the DC bias voltage source and a center tap of the secondary inductor.

In Example 14, the subject matter of Examples 12-13 includes, providing a grounded capacitor coupled between the L-C filter and the DC voltage source.

In Example 15, the subject matter of Example 14 includes, configuring a capacitance of the grounded capacitor, the capacitance of the grounded capacitor resulting in filtering low-frequency noise signals generated by the DC bias voltage source.

Example 16 is an apparatus for a communication device, the apparatus comprising: a power amplifier stage, the power amplifier stage comprising: a transformer, the transformer driven by a differential baseband signal based on a local oscillator (LO) signal; and a direct current (DC) bias voltage source, the DC bias voltage source coupled to the transformer via a filter arrangement; wherein the filter arrangement comprises at least one inductor associated with an inductance value, the inductance value based on a secondary inductance of the transformer and a harmonic frequency of the LO signal.

In Example 17, the subject matter of Example 16 includes subject matter where the filter arrangement comprises at least one L-C filter, and wherein the at least one L-C filter is associated with a capacitance value, the capacitance value, and the inductance value resulting in a rejection frequency associated with a fourth-order harmonic of the LO signal.

In Example 18, the subject matter of Examples 16-17 includes subject matter where the transformer comprises a primary inductor and a secondary inductor, and wherein the DC bias voltage source is coupled to the secondary inductor via an electric connection including the filter arrangement, wherein the electric connection couples the DC bias voltage source and a center tap of the secondary inductor.

In Example 19, the subject matter of Examples 16-18 includes a grounded capacitor, the grounded capacitor coupled between the filter arrangement and the DC voltage source.

In Example 20, the subject matter of Example 19 includes subject matter where the grounded capacitor is configured to filter low-frequency noise signals generated by the DC bias voltage source.

Example 21 is at least one machine-readable medium including instructions that, when executed by processing circuitry, cause the processing circuitry to perform operations to implement any of Examples 1-20.

Example 22 is an apparatus comprising means to implement any of Examples 1-20.

Example 23 is a system to implement any of Examples 1-20.

Example 24 is a method to implement any of Examples 1-20.

The above description is intended to be illustrative, and not restrictive. For example, the above-described examples (or one or more aspects thereof) may be used in combination with others. Other embodiments may be used, such as by one of ordinary skill in the art upon reviewing the above description. The Abstract is to allow the reader to quickly ascertain the nature of the technical disclosure. It is submitted with the understanding that it will not be used to interpret or limit the scope or meaning of the claims. Also, in the above Detailed Description, various features may be grouped to streamline the disclosure. However, the claims may not set forth every feature disclosed herein as embodiments may feature a subset of said features. Further, embodiments may include fewer features than those disclosed in a particular example. Thus, the following claims are hereby incorporated into the Detailed Description, with a claim standing on its own as a separate embodiment. The scope of the embodiments disclosed herein is to be determined regarding the appended claims, along with the full scope of equivalents to which such claims are entitled.

What is claimed is:

1. An apparatus for a communication device, the apparatus comprising:
baseband circuitry to generate a differential baseband signal using a local oscillator (LO) signal;
matching circuitry, comprising:
a transformer to receive the differential baseband signal and generate a transformed signal based on the differential baseband signal; and
a direct current (DC) bias voltage source, the DC bias voltage source coupled to the transformer via a filter arrangement, the filter arrangement configured to reduce a signal level of at least one harmonic of the LO signal from the transformed signal; and
amplification circuitry to amplify the transformed signal.

2. The apparatus of claim 1, wherein the at least one harmonic is an even-order harmonic of the LO signal.

3. The apparatus of claim 1, wherein the at least one harmonic is a fourth-order harmonic of the LO signal.

4. The apparatus of claim 1, wherein the filter arrangement is an L-C filter.

5. The apparatus of claim 4, wherein the L-C filter is configured with capacitance and inductance values resulting in a rejection frequency associated with a fourth-order harmonic of the LO signal.

6. The apparatus of claim 1, wherein the transformer comprises a primary inductor and a secondary inductor, and wherein the DC bias voltage source is coupled to the secondary inductor via an electric connection including the filter arrangement.

7. The apparatus of claim 6, wherein the electric connection couples the DC bias voltage source and a center tap of the secondary inductor.

8. The apparatus of claim 1, further comprising a grounded capacitor, the grounded capacitor coupled between the filter arrangement and the DC voltage source.

9. The apparatus of claim 8, wherein the grounded capacitor is configured to filter low-frequency noise signals generated by the DC bias voltage source.

10. The apparatus of claim 1, wherein the filter arrangement comprises a single inductor and a plurality of switchable unit capacitors.

11. A method for harmonic trapping in a matching network of a power amplifier, the method comprising:
determining primary inductance and secondary inductance of a differential transformer of the matching network, based on a signal operating frequency of the power amplifier;
determining an inductance value for an L-C filter, based on the secondary inductance and a harmonic frequency of a local oscillator (LO) signal;
determining a capacitance value for the L-C filter, based on the inductance value and the harmonic frequency of the LO signal; and
providing the L-C filter on an electric connection between a direct current (DC) bias voltage source and a secondary inductor of the differential transformer, the L-C filter configured with the determined inductance value and the determined capacitance value.

12. The method of claim 11, further comprising:
determining the inductance value further based on a stability frequency, the stability frequency corresponding to a minimal positive real part of a common-mode feedback impedance of the power amplifier.

13. The method of claim 12, further comprising:
coupling the electric connection between the DC bias voltage source and a center tap of the secondary inductor.

14. The method of claim 12, further comprising:
providing a grounded capacitor coupled between the L-C filter and the DC voltage source.

15. The method of claim 14, further comprising:
configuring a capacitance of the grounded capacitor, the capacitance of the grounded capacitor resulting in filtering low-frequency noise signals generated by the DC bias voltage source.

16. An apparatus for a communication device, the apparatus comprising:
a power amplifier stage, the power amplifier stage comprising:
a transformer, the transformer driven by a differential baseband signal based on a local oscillator (LO) signal; and
a direct current (DC) bias voltage source, the DC bias voltage source coupled to the transformer via a filter arrangement;
wherein the filter arrangement comprises at least one inductor associated with an inductance value, the inductance value based on a secondary inductance of the transformer, and a harmonic frequency of the LO signal.

17. The apparatus of claim 16, wherein the filter arrangement comprises at least one L-C filter, and wherein the at least one L-C filter is associated with a capacitance value, the capacitance value, and the inductance value resulting in a rejection frequency associated with a fourth-order harmonic of the LO signal.

18. The apparatus of claim 16, wherein the transformer comprises a primary inductor and a secondary inductor, and wherein the DC bias voltage source is coupled to the secondary inductor via an electric connection including the filter arrangement, wherein the electric connection couples the DC bias voltage source and a center tap of the secondary inductor.

19. The apparatus of claim 16, further comprising a grounded capacitor, the grounded capacitor coupled between the filter arrangement and the DC voltage source.

20. The apparatus of claim 19, wherein the grounded capacitor is configured to filter low-frequency noise signals generated by the DC bias voltage source.

* * * * *